US010168810B2

(12) United States Patent
Omata et al.

(10) Patent No.: US 10,168,810 B2
(45) Date of Patent: Jan. 1, 2019

(54) ORGANIC ELECTROLUMINESCENT MODULE, SMART DEVICE, AND ILLUMINATION APPARATUS

(71) Applicant: KONICA MINOLTA, INC., Tokyo (JP)

(72) Inventors: Kazuyoshi Omata, Kofu (JP); Tsukasa Yagi, Kobe (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/569,330

(22) PCT Filed: Mar. 14, 2016

(86) PCT No.: PCT/JP2016/057968
§ 371 (c)(1),
(2) Date: Oct. 25, 2017

(87) PCT Pub. No.: WO2016/185775
PCT Pub. Date: Nov. 24, 2016

(65) Prior Publication Data
US 2018/0113543 A1    Apr. 26, 2018

(30) Foreign Application Priority Data

May 20, 2015 (JP) ................................. 2015-102804

(51) Int. Cl.
*G09G 3/3233* (2016.01)
*G06F 3/045* (2006.01)
(Continued)

(52) U.S. Cl.
CPC ............ *G06F 3/0412* (2013.01); *G06F 3/041* (2013.01); *G06F 3/044* (2013.01); *G06F 3/045* (2013.01);
(Continued)

(58) Field of Classification Search
CPC ........ G06F 3/0412; G06F 3/041; G06F 3/044; G06F 3/045; G09G 3/3233
See application file for complete search history.

(56) References Cited

U.S. PATENT DOCUMENTS 4,290,061 A  *  9/1981  Serrano .............. H03K 17/9622
                                                        341/33
6,084,579 A  *  7/2000  Hirano ................. G09G 3/3216
                                                        315/169.3
(Continued)

FOREIGN PATENT DOCUMENTS

JP    2007534070 A    11/2007
JP    2012094291 A    10/2012
JP    2013065429 A     4/2013

OTHER PUBLICATIONS

Extended European Search Report dated Apr. 20, 2018 from corresponding European Application No. 1679619.7.
(Continued)

*Primary Examiner* — Kevin M Nguyen
(74) *Attorney, Agent, or Firm* — Lucas & Mercanti, LLP

(57) ABSTRACT

Provided is an organic electroluminescent module with: an organic electroluminescent device in which an organic luminescent functional layer is provided between a pair of electrodes; a luminescent-device driving circuit unit that is connected to the pair of the electrodes and controls the luminescence of the organic electroluminescent device; and a touch-position detection circuit unit that is connected to both ends of a detection electrode in a touch-position detection direction, which is either of the pair of electrodes, wherein the touch-position detection circuit unit performs the touch-position detection by detecting electrical characteristics at both ends of the detection electrode.

12 Claims, 11 Drawing Sheets

(51) Int. Cl.
  *G06F 3/044*    (2006.01)
  *G06F 3/041*    (2006.01)
  *H01L 51/50*    (2006.01)
  *H01L 27/32*    (2006.01)

(52) U.S. Cl.
  CPC ......... *G09G 3/3233* (2013.01); *H01L 27/323* (2013.01); *H01L 51/50* (2013.01); *G09G 2300/0426* (2013.01); *G09G 2320/064* (2013.01)

(56) References Cited

U.S. PATENT DOCUMENTS

| | | | | |
|---|---|---|---|---|
| 8,638,314 | B2 * | 1/2014 | Sleeman | G06F 3/0412 178/18.01 |
| 2003/0159910 | A1 * | 8/2003 | Caldwell | A47B 57/00 200/310 |
| 2008/0036746 | A1 * | 2/2008 | Klinghult | G06F 3/0412 345/176 |
| 2009/0009487 | A1 | 1/2009 | Nishitani et al. | |
| 2013/0343084 | A1 | 12/2013 | Okuda et al. | |

OTHER PUBLICATIONS

International Search Report dated May 24, 2016 for PCT/JP2016/057968 and English translation.

* cited by examiner

ORGANIC ELECTROLUMINESCENT MODULE, SMART DEVICE, AND ILLUMINATION APPARATUS

CROSS REFERENCE TO RELATED APPLICATION

This Application is a 371 of PCT/JP2016/057968 filed on Mar. 14, 2016 which, in turn, claimed the priority of Japanese Patent Application No. 2015-102804 filed on May 20, 2015, both applications are incorporated herein by reference.

TECHNICAL FIELD

The present invention relates to an organic electroluminescent module having a touch detection function, and a smart device and an illumination apparatus including the module.

BACKGROUND ART

In a smart device such as a smartphone or a tablet, a touch sensor is an indispensable component for allowing information to be input from a display unit, the touch sensor being provided in a manner overlaid on the display unit, for example.

In addition, from the viewpoint of operability, a smart device may have provided thereon, besides the main display unit, common function key buttons (so-called icons) such as a "home key" expressed as a quadrangular mark or the like, or a "return key" expressed as an arrow mark or the like. A common function key button is implemented using a planar light source in accordance with the pattern shape of the mark to be displayed in terms of improved visibility, and there is disclosed, for example, a configuration having an LED light guiding panel, which is a combination of an LED (Light Emitting Diode) and a light guiding panel, installed in the smart device (see, for example, Patent Literature 1 below).

In a smart device, also the aforementioned common function key button has provided thereon, in an overlaid manner, a touch sensor common to the main display unit implemented using a liquid crystal display device, for example.

In recent years, however, there has appeared an "in-cell" or "on-cell" liquid crystal display device with a built-in sensor electrode as a display for use in the main display unit. Accordingly, there is a strong demand to provide an independent touch detection function to the planar light source included in the common function key button.

There is disclosed a configuration of a planar light source provided with a touch detection function (see, for example, Patent Literature 2 below), in which a circuit board having for example a sensor electrode formed thereon is provided between a surface panel having an icon provided thereon and an LED light guiding panel, a through-hole is provided on apart of the circuit board where the icon is formed, and a layer of adhesive with a high dielectric constant is provided between the surface panel and the circuit board, whereby it is expected to improve the precision of capacitance detection by the sensor electrode.

CITATION LIST

Patent Literature

PTL 1: Japanese Patent Laid-Open No. 2012-194291
PTL 2: Japanese Patent Laid-Open No. 2013-065429

SUMMARY OF INVENTION

Technical Problem

Incidentally, in recent years, there is a trend of using an organic electroluminescent device in place of the LED light guiding panel as the planar light source to be applied to the aforementioned icon part. The organic electroluminescent device, which is a surface-emitting device having an organic luminescent functional layer sandwiched between the anode and the cathode, allows for surface-emission that exhibits high uniformity of light emission luminance with lower power consumption.

However, overlaying the touch sensor on the organic electroluminescent device may cause the anode, the cathode, or a metal foil layer used for protection to adversely affect the detection of capacitance variation occurring between the sensor electrode and the touch surface. Accordingly, when providing the organic electroluminescent device with a capacitive touch function, a touch panel provided with a touch sensor is required to be installed as a separate member from the display panel provided with the organic electroluminescent device, which has been an obstructive factor against thinning of devices and reduction of production hours.

It is therefore an object of the present invention to provide an organic electroluminescent module with a touch function, a smart device and an illumination apparatus using thereof, which allows for thinning of devices and reduction of production hours.

Solution to Problem

In order to achieve the aforementioned object, one embodiment of the present invention is an organic electroluminescent module including: an organic electroluminescent device having an organic luminescent functional layer provided between a pair of electrodes; a luminescent-device driving circuit unit connected to the pair of electrodes to control luminescence of the organic electroluminescent device; and a touch-position detection circuit unit connected to both ends of a detection electrode in a touch-position detection direction, the detection electrode being one of the pair of electrodes, wherein the touch-position detection circuit unit performs detection of a touch-position by detecting electrical characteristics at both ends of the detection electrode.

In addition, other embodiments of the present invention are a smart device and an illumination apparatus including an organic electroluminescent module configured as described above.

Advantageous Effects of Invention

According to the above-described embodiments of the present invention, it is possible to obtain an organic electroluminescent module with a touch function, a smart device and an illumination apparatus using thereof, which allows for thinning of devices and reduction of production hours.

DESCRIPTION OF EMBODIMENTS

In the following, an embodiment of an organic electroluminescent module, a smart device, and an illumination apparatus of the present invention will be described on the basis of drawings. The organic electroluminescent module described below has a capacitive touch detection function provided on an organic electroluminescent device, allowing information to be input by contact of a finger or the like on the display surface. In addition, the smart device and the illumination apparatus include the aforementioned organic electroluminescent module. In the following, description will be provided in sequence, starting from an embodiment of the organic electroluminescent module.

First Embodiment

Figure 1:
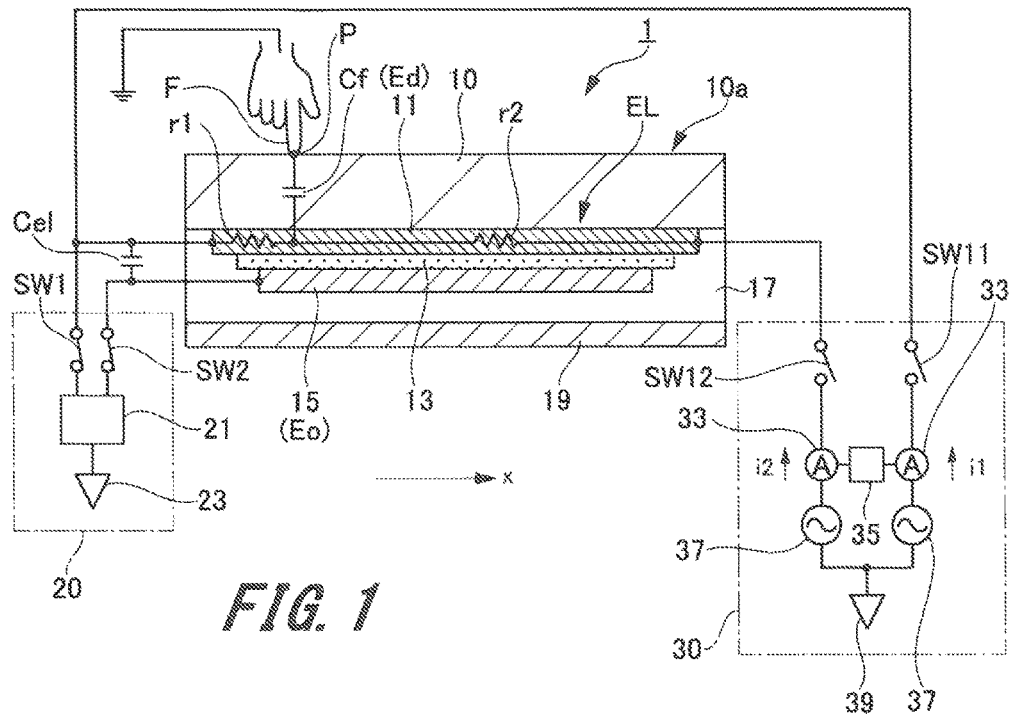
FIG. 1 is a configuration diagram for explaining an organic electroluminescent module of a first embodiment, the diagram describing a light-emitting period.

FIG. 1 is a configuration diagram for explaining an organic electroluminescent module 1 of a first embodiment. The organic electroluminescent module 1 illustrated in the drawing includes an organic electroluminescent device EL provided on a main surface of a supporting substrate 10, a luminescent-device driving circuit unit 20, and a touch-position detection circuit unit 30, and has a touch detection function for detecting a touch-position P on the surface of the supporting substrate 10. In the following, details of the components will be described.

<Organic Electroluminescent Device EL>

The organic electroluminescent device EL is configured to include a lower electrode 11, an organic luminescent functional layer 13, and an upper electrode 15 laminated in sequence from the supporting substrate 10 side, the organic luminescent functional layer 13 being provided between the lower electrode 11 and the upper electrode 15. On the organic electroluminescent device EL described above, a part where the organic luminescent functional layer 13 is sandwiched between the lower electrode 11 and the upper electrode 15 turns out to be a luminescent region. In addition, the organic electroluminescent device EL is configured to be a capacitor and therefore has a parasitic capacitance Cel.

In addition, the organic electroluminescent device EL is covered and sealed with sealing adhesive 17 from the upper electrode 15 side, and further has a sealing member 19 provided on the surface for the purpose of preventing penetration of hazardous gas (oxygen, water, etc.) from external environment so as to form a single display panel. In the organic electroluminescent device EL described above, causing current to flow in the forward direction between the lower electrode 11 and the upper electrode 15, one being the anode and the other being the cathode, generates emitted light in the organic luminescent functional layer 13. In the following, details of respective components of each of the organic electroluminescent device EL will be described. Note that applying a constant current or a constant voltage to the organic electroluminescent device EL in the forward direction refers to a state in which a voltage is applied with the anode being the positive electrode and the cathode being the negative electrode, and the same goes for the following description.

—Supporting Substrate 10—

Here, the supporting substrate 10 is formed for example by a light-transmissive material, the surface thereof being a display surface from which the emitted light generated in the organic luminescent functional layer 13 is taken out. In addition, the display surface is also a touch surface 10a on which information is input by contact of a finger-tip, a touch pen, or the like (hereafter, finger-tip F). Note that, input of information by contact of the finger-tip F on the touch surface 10a will be referred to as a touch operation hereafter.

The transparent substrate material forming the supporting substrate 10 as described above may be, for example, a transparent substrate material such as glass or plastic. A transparent substrate material preferred to be used may be glass, quartz, or resin film from the view point of having flexibility. In addition, the supporting substrate 10 may be configured to include a gas barrier layer as necessary. Furthermore, cover glass may be adhered on the display surface side of the supporting substrate 10 as necessary and, in such a case, the surface of a cover glass turns out to be the touch surface 10a.

—Lower Electrode 11—

The lower electrode 11 is configured here as a transparent electrode at the light taking-out side. The lower electrode 11, being provided as an anode or a cathode for the organic luminescent functional layer 13, is used as an anode when the upper electrode 15 is used as a cathode, or used as a cathode when the upper electrode 15 is used as an anode. The lower electrode 11 is configured using an electroconductive material with high light transmissivity among electroconductive materials suitable in respective viewpoints.

Particularly herein, the lower electrode 11 is provided closer to the touch surface 10a than the upper electrode 15 and therefore preferably used as a detection electrode Ed for detecting the touch-position P. Accordingly, the touch-position detection circuit unit 30 is connected, together with the luminescent-device driving circuit unit 20, to the lower electrode 11 which is the detection electrode Ed. The connection state thereof will be described below.

—Organic Luminescent Functional Layer 13—

The organic luminescent functional layer 13 is a layer including a luminescent layer formed with at least an organic material. The overall layer structure of the organic luminescent functional layer 13 described above may be structured as a general layer in a non-limiting manner. Although an example of the organic luminescent functional layer 13 is illustrated below, the present invention is not limited thereto.

(i) (anode)/positive hole injection and transportation layer/luminescent layer/electron injection and transportation layer/(cathode)

(ii) (anode)/positive hole injection and transportation layer/luminescent layer/positive hole blocking layer/electron injection and transportation layer/(cathode)

(iii) anode/positive hole injection and transportation layer/electron blocking layer/luminescent layer/positive hole blocking layer/electron injection and transportation layer/(cathode)

(iv) (anode)/positive hole injection layer/positive hole transportation layer/luminescent layer/electron transportation layer/electron injection layer/(cathode)

(v) (anode)/positive hole injection layer/positive hole transportation layer/luminescent layer/positive hole blocking layer/electron transportation layer/electron injection layer/(cathode)

(vi) (anode)/positive hole injection layer/positive hole transportation layer/electron blocking layer/luminescent layer/positive hole blocking layer/electron transportation layer/electron injection layer/(cathode)

Note that the luminescent layer may be of a laminated layer structure, and may have a non-light-emitting intermediate layer provided between respective luminescent layers. The intermediate layer may be an electric charge generating layer, or may be configured as a multi-photon unit.

—Upper Electrode 15—

The upper electrode 15 provided as a cathode or an anode for the organic luminescent functional layer 13 is used as the cathode when the lower electrode 11 is used as the anode, or used as the anode when the lower electrode 11 is used as the cathode. The upper electrode 15 described above is configured as a transparent electrode when the organic electroluminescent device EL takes out the emitted light also from the upper electrode 15 side. When, on the other hand, the organic electroluminescent device EL takes out the emitted light only from the lower electrode 11, the upper electrode 15 is configured as a reflective electrode. Therefore, the upper electrode 15 is configured using an electroconductive material with high light transmissivity or light reflectivity among electroconductive materials suitable as a cathode or an anode.

The upper electrode 15 described above is connected to the luminescent-device driving circuit unit 20 together with the lower electrode 11. The connected state of the luminescent-device driving circuit unit 20 to the upper electrode 15 will be described below. In addition, the upper electrode 15 also turns out to be a counter electrode Eo against the detection electrode Ed including the lower electrode 11.

Note that, although the side facing outward on the supporting substrate 10 is assumed to be the touch surface 10a here, the side facing outward on the sealing member 19 opposite to the supporting substrate 10 may be used as the touch surface and, in such a case, it is preferred to use the upper electrode 15 which is close to the touch surface as the detection electrode Ed. Also in this case, the upper electrode 15 turns out to be configured as a transparent electrode, and the lower electrode 11 turns out to be the counter electrode Eo.

—Sealing Adhesive 17—

The sealing adhesive 17 is used as sealant for sealing the organic electroluminescent device EL sandwiched between the sealing member 19 and the supporting substrate 10. Specifically, photo-curing or heat curing adhesive having reactive vinyl groups of acrylic acid-based oligomer or methacrylic acid-based oligomer, moisture curing adhesive such as 2-cyanoacrylic ester, heat and chemical curing (two-part mixture) adhesive such as epoxy-based adhesive, or the like may be used as the sealing adhesive 17 described above, or desiccating agent may be used in a dispersion.

—Sealing Member 19—

The sealing member 19, which suffices to be provided in a manner covering the display region of the organic electroluminescent device EL, may be shaped like a concave board or a flat board. In addition, transparency and electric insulation characteristics are not limited in particular. Specifically, although glass board, polymer board, film, metal plate, film or the like may be used, polymer film and metal film can be preferably used from the viewpoint of their capability of fabricating the organic electroluminescent module 1 into thin film. When using polymer film, however, it is important to use a type with low steam permeation.

Note that the gap between the sealing member 19 and the organic electroluminescent device EL need not necessarily be filled with the sealing adhesive 17, and particularly the display region (luminescent region) is preferred to have inert gas such as nitrogen or argon sealed therein when in gas phase, or inert liquid such as fluorohydrocarbon or silicone oil injected therein when in liquid phase. In addition, it is also possible to vacuumize the gap between the sealing member 19 and the display region of the organic electroluminescent device EL, or seal hygroscopic compound in the gap.

Note that, although the side facing outward on the supporting substrate 10 is assumed to be the touch surface 10a here, the side facing outward on the sealing member 19 may be used as the touch surface and, in such a case, the sealing member 19 is made of a light-transmissive material.

<Luminescent-Device Driving Circuit Unit 20>

The luminescent-device driving circuit unit 20 is capable of controlling luminescence from the organic electroluminescent device EL, and also setting the upper electrode 15 being used as the counter electrode Eo to a floating potential. Here, the luminescent-device driving circuit unit 20 is configured so that the connection between the lower electrode 11 and the upper electrode 15 may be freely disconnected. The luminescent-device driving circuit unit 20 described above includes a luminescence driving circuit 21 connected to the lower electrode 11 and the upper electrode 15 of the organic electroluminescent device EL, a switch SW1 provided between the luminescence driving circuit 21 and the lower electrode 11, and a switch SW2 provided between the luminescence driving circuit 21 and the upper electrode 15. The luminescence driving circuit 21 is connected to a ground 23. Details of respective components are as follows.

—Luminescence Driving Circuit 21—

The luminescence driving circuit 21 controls luminescence in the organic electroluminescent device EL by applying voltage between the lower electrode 11 and the upper electrode 15. Control of luminescence from the organic electroluminescent device EL by the luminescence driving circuit 21 may be either constant current drive or constant voltage drive, to which a constant current driving circuit or a constant voltage driving circuit in the normal organic electroluminescent device EL is applied.

—Switches SW1 and SW2—

The switches SW1 and SW2 are provided to freely control the connection state between the luminescence driving circuit 21 and the lower electrode 11, and the connected state between the luminescence driving circuit 21 and the upper electrode 15. The switches SW1 and SW2 described above respectively include, for example, a thin film transistor (TFT) and a control circuit which controls its driving. The switches SW1 and SW2 in this case are configured such that either the source or the drain of the TFT is connected to the luminescence driving circuit 21 and the other is connected to the lower electrode 11 or the upper electrode 15, with the gate electrode of TFT being connected to the control circuit. Accordingly, applied voltage to the gate electrode of the TFT allows for freely controlling the connection state between the luminescence driving circuit 21 and the lower electrode 11, and the connected state between the luminescence driving circuit 21 and the upper electrode 15.

Here, a state in which the luminescence driving circuit 21 is connected to both the lower electrode 11 and the upper electrode 15 due to driving of the switches SW1 and SW2 is referred to as the switches SW1 and SW2 being turned "ON". In contrast, a state in which connection of the luminescence driving circuit 21 to both the lower electrode 11 and the upper electrode 15 is disconnected due to driving of the switches SW1 and SW2 is referred to as the switches SW1 and SW2 being turned "OFF".

Turning the switches SW1 and SW2 "ON" allows the luminescence driving circuit 21 to control luminescence from the organic electroluminescent device EL. In addition, turning the switches SW1 and SW2 "OFF" disconnects the connection of the luminescence driving circuit 21 to both the lower electrode 11 and the upper electrode 15 of the organic electroluminescent device EL. Accordingly, it is possible to set the upper electrode 15 being used as the counter electrode Eo to a floating potential.

The aforementioned control of turning the switches SW1 and SW2 "ON" or "OFF" is performed in synchronization with switches SW11 and SW12 of the touch-position detection circuit unit 30 as will be described in the following timing chart. Note that, although the luminescence driving circuit 21, and the switches SW1 and SW2, are illustrated in FIG. 1 as being configured independently of each other, there may be a configuration such that the switches SW1 and SW2 are built in the luminescence driving circuit 21 as necessary. In addition, the control circuit of the switches SW1 and SW2 may be an external arithmetic operation apparatus.

—Ground 23—

The ground 23 may be a signal ground formed with a circuit pattern, or may be a frame ground such as a metal case in which the organic electroluminescent module 1 is provided.

<Touch-Position Detection Circuit Unit 30>

The touch-position detection circuit unit 30 is a component connected to both ends of the lower electrode 11 used as the detection electrode Ed in a touch-position detection direction x, the lower electrode 11 being included in the organic electroluminescent device EL together with the upper electrode 15. The touch-position detection circuit unit 30 detects electrical characteristics at both ends of the detection electrode Ed. Accordingly, a touch-position in the touch-position detection direction x is detected, with a one-dimensional direction between the both ends of the detection electrode Ed being the touch-position detection direction x.

The touch-position detection circuit unit 30 described above includes the switches SW11 and SW12 connected to both ends of the detection electrode Ed, two ammeters 33 connected to each of the switches SW11 and SW12, and an arithmetic operation unit 35 and a power source 37 connected to the respective ammeters 33. The power source 37 is connected to the ground 39. Details of respective components are as follows.

—Switches SW11 and SW12—

The switches SW11 and SW12 are provided to freely control the connection state between one end of the detection electrode Ed and one of the ammeters 33, and the connected state between the other end of the detection electrode Ed and the other one of the ammeters 33. The switches SW11 and SW12 described above respectively include for example a thin film transistor (TFT) and a control circuit which controls its driving. In this case the switches SW11 and SW12 are configured such that either the source or the drain of the TFT is connected to the detection electrode Ed and the other is connected to the ammeters 33, with the gate electrode of the TFT being connected to the control circuit. Accordingly, application of a voltage to the gate electrode of the TFT allows for freely controlling the connection state between one end of the detection electrode Ed and one of the ammeters 33, and the connected state between the other end of the detection electrode Ed and the other one of the ammeters 33.

Figure 2:
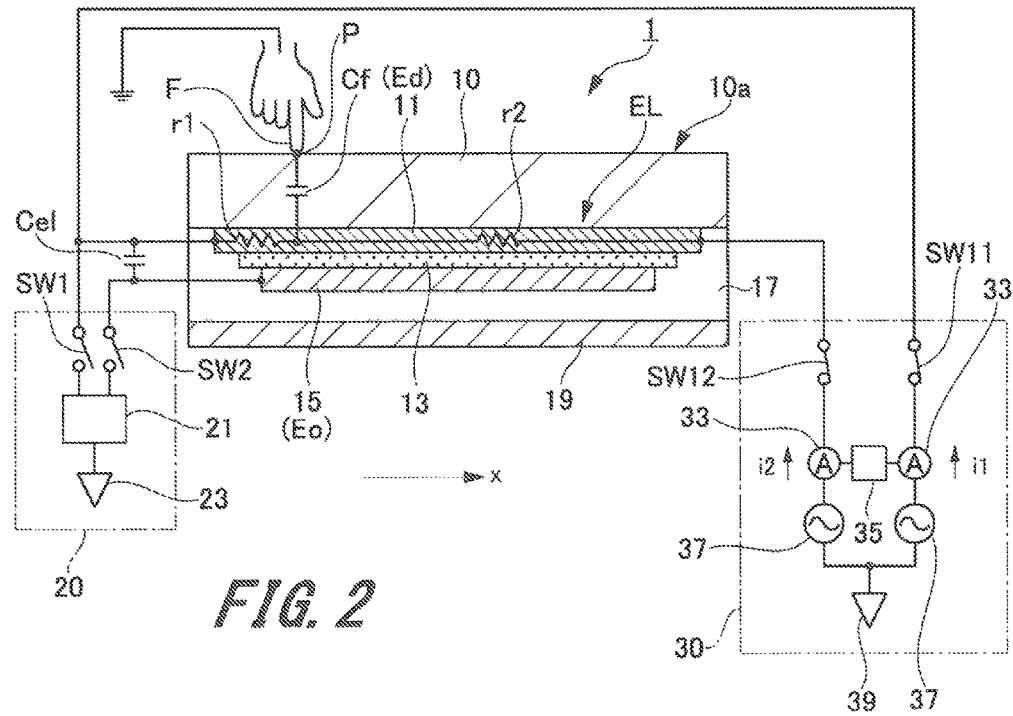
FIG. 2 is a configuration diagram for explaining a touch-position detection period in the first embodiment.

Here, a state in which the detection electrode Ed is connected to the ammeters 33 due to driving of the switches SW11 and SW12 is referred to as the switches SW11 and SW12 being in an "ON" state (see FIG. 2). In contrast, a state in which connection of the detection electrode Ed to the ammeters 33 is disconnected due to driving of the switches SW11 and SW12 is referred to as the switches SW11 and SW12 being turned "OFF".

The switches SW11 and SW12 described above are driven in synchronization with the switches SW1 and SW2 of the luminescent-device driving circuit unit 20, and the switches SW11 and SW12 turn "OFF" when the switches SW1 and SW2 are "ON". On the other hand, the switches SW11 and SW12 turn "ON" when the switches SW1 and SW2 are "OFF". Note that the control circuit of the switches SW11 and SW12 may be an external arithmetic operation apparatus.

—Ammeters 33—

The ammeters 33 respectively measure current flowing at both ends of the detection electrode Ed.

—Arithmetic Operation Unit 35—

The arithmetic operation unit 35 calculates, from two current values i1 and i2 measured by the two ammeters 33, a position on which a touch operation has been performed in a touch-position detection direction on the touch surface 10a of the detection electrode Ed. Here, a resistance ratio is calculated from the ratio of the current values i1 and i2 as indicated in the following formula (1), and the touch-position P in the touch-position detection direction x between both ends of the detection electrode Ed corresponding to the resistance ratio is obtained. Note that r1 in the following formula (1) is a resistance value between one of the ends of the detection electrode Ed at which the current value i1 is measured and the touch-position P, the resistance value corresponding to the distance from the end at which the current value i1 is measured to the touch-position P. In addition, r2 is the resistance value between one of the ends of the detection electrode Ed, at which current value i2 is measured, and the touch-position P, the resistance value corresponding to the distance from the end at which the current value i2 is measured to the touch-position P.

$$r1/(r1+r2)=i2/(i1+i2) \quad \text{formula (1)}$$

—Power Source 37—

The power source 37 may be either an alternating-current power source or a direct-current power source, provided that it is capable of applying a predetermined voltage.

—Ground 39—

The ground 39 may be a signal ground formed with a circuit pattern, or may be a frame ground such as a metal case in which the organic electroluminescent module 1 is provided. The ground 39 may be identical to, or different from the ground 23 at the side of the luminescent-device driving circuit unit 20.

<Operation of Organic Electroluminescent Module 1 (First Example)>

Figure 3:
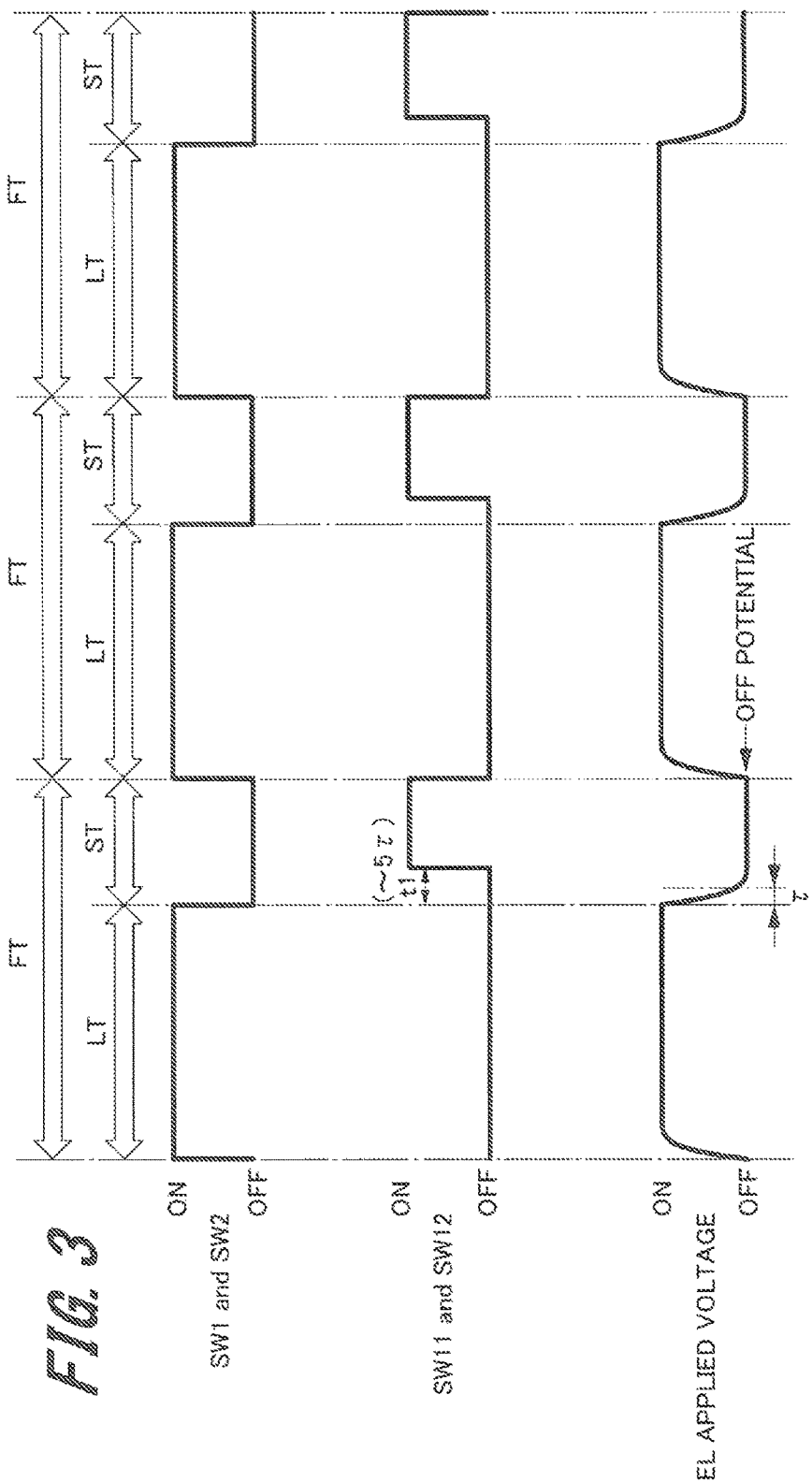
FIG. 3 is a timing chart for explaining an operation (first example) of the organic electroluminescent module of the first embodiment.

FIG. 3 is a timing chart illustrating a first example of the operation of the organic electroluminescent module 1 configured as described above, the chart describing the operation of the organic electroluminescent module 1 performed by the luminescent-device driving circuit unit 20 and the touch-position detection circuit unit 30.

The upper part of FIG. 3 is a graph indicating the timing of turning the switches SW1 and SW2 "ON" or "OFF" in the luminescent-device driving circuit unit 20. The middle part is a graph indicating the timing of turning the switches SW11 and SW12 "ON" or "OFF" in the touch-position detection circuit unit 30. In the timing charts illustrated here, the "high" period indicates the "ON" state and the "low" period indicates the "OFF" state. The lower part is a graph indicating the history of voltage application in the organic electroluminescent device EL. The foregoing description similarly applies to other timing charts described below.

In the following, the first example of the operation of the organic electroluminescent module 1 will be described referring to FIGS. 1 and 2, on the basis of the timing chart of FIG. 3.

As illustrated in FIG. 3, the operation period of the organic electroluminescent module 1 repeatedly includes, alternately in each single-frame period FT, a light-emitting period LT during which the organic electroluminescent device EL emits light and a touch-position detection period ST during which detection of the touch-position P is performed. The following driving is performed during each period.

—Light-Emitting Period LT—

During the light-emitting period LT assigned to the first half of the single-frame period FT, the luminescent-device driving circuit unit 20 turns the switches SW1 and SW2 "ON". On the other hand, the touch-position detection circuit unit 30 turns the switches SW11 and SW12 "OFF".

Accordingly, as illustrated in FIG. 1, the organic electroluminescent device EL and the luminescence driving circuit 21 are connected in the luminescent-device driving circuit unit 20, whereby luminescence control of the organic electroluminescent device EL by the luminescence driving circuit 21 becomes possible. Here, the luminescence driving circuit 21 applies a constant current or a constant voltage to the organic electroluminescent device EL in the forward direction in synchronization with turning the switches SW1 and SW2 "ON". Accordingly, the applied voltage of the organic electroluminescent device EL rises from the "OFF" potential as illustrated in the lower part of FIG. 3, and luminescence is started at a time point when the current value or the voltage value required for luminescence is reached.

On the other hand, in the touch-position detection circuit unit 30, the connected state between the detection electrode Ed and the ammeters 33 is disconnected in order to turn the switches SW11 and SW12 "OFF" during the light-emitting period LT, whereby it is impossible to detect the touch-position P.

—Touch-Position Detection Period ST—

As illustrated in FIG. 3, the luminescent-device driving circuit unit 20 turns the switches SW1 and SW2 "OFF" during the touch-position detection period ST assigned to the latter half of the single-frame period FT. On the other hand, the touch-position detection circuit unit 30 turns the switches SW11 and SW12 "ON".

Accordingly, as illustrated in FIG. 2, the connection between the organic electroluminescent device EL and the luminescence driving circuit 21 is disconnected in the luminescent-device driving circuit unit 20, and the application of voltage to the organic electroluminescent device EL is terminated. Therefore, as illustrated in the lower part of FIG. 3, the applied voltage of the organic electroluminescent device EL decreases to the "OFF" potential, thereby turning off the organic electroluminescent device EL.

On the other hand, in the touch-position detection circuit unit 30, the switches SW11 and SW12 turn "ON" so that the detection electrode Ed and the ammeters 33 are brought into a connected state, making it possible to perform detection of the touch-position P on the basis of the current value measured by the ammeters 33.

Here, with regard to the touch-position detection period ST, the switches SW1 and SW2 of the luminescent-device driving circuit unit 20 turn "OFF" in synchronization with the start of the period, for example. However, even when the switches SW1 and SW2 turn "OFF", the organic electroluminescent device EL does not immediately drop to the "OFF" potential and go out, but takes a certain time to be turned off in accordance with the electric discharge time constant $\tau$ (1/e) of the organic electroluminescent device EL. Therefore, with regard to the touch-position detection period ST, there is provided a predetermined waiting period t1 after the start of the touch-position detection period ST, and the switches SW11 and SW12 of the touch-position detection circuit unit 30, turn "ON" at the time point when the waiting period t1 has expired. The waiting period t1 is supposed to be equal to or smaller than 5 times the electric discharge time constant $\tau$ of the organic electroluminescent device EL, whereby it is possible to measure a stabilized current value by the ammeters 33 and perform detection of the touch-position P on the basis of the result by completely discharging the organic electroluminescent device EL and setting it to the "OFF" potential, while keeping the waiting period t1 to a minimum.

Note that the lengths of the light-emitting period LT, the touch-position detection period ST, and the single-frame period FT for the organic electroluminescent module 1 are not particularly limited, and conditions suitable for the environment to be applied may be selected as appropriate; for example, the light-emitting period LT of the organic electroluminescent device EL may be in a range of 0.1 to 2.0 msec., the touch-position detection period ST in a range of 0.05 to 0.3 msec., and the single-frame period FT in a range of 0.15 to 2.3 msec. In addition, it is preferred to set the single-frame period FT to 60 Hz or higher for the purpose of reducing flicker, or a general cycle of image display may be applied.

In addition, when the length of the single-frame period FT is predetermined, there may be a configuration such that the ratio between the light-emitting period LT and the touch-position detection period ST during the single-frame period FT is arbitrarily set, taking into account the precision of touch-position detection by the organic electroluminescent module 1.

<Operation of Organic Electroluminescent Module 1 (Second Example)>

Figure 4:
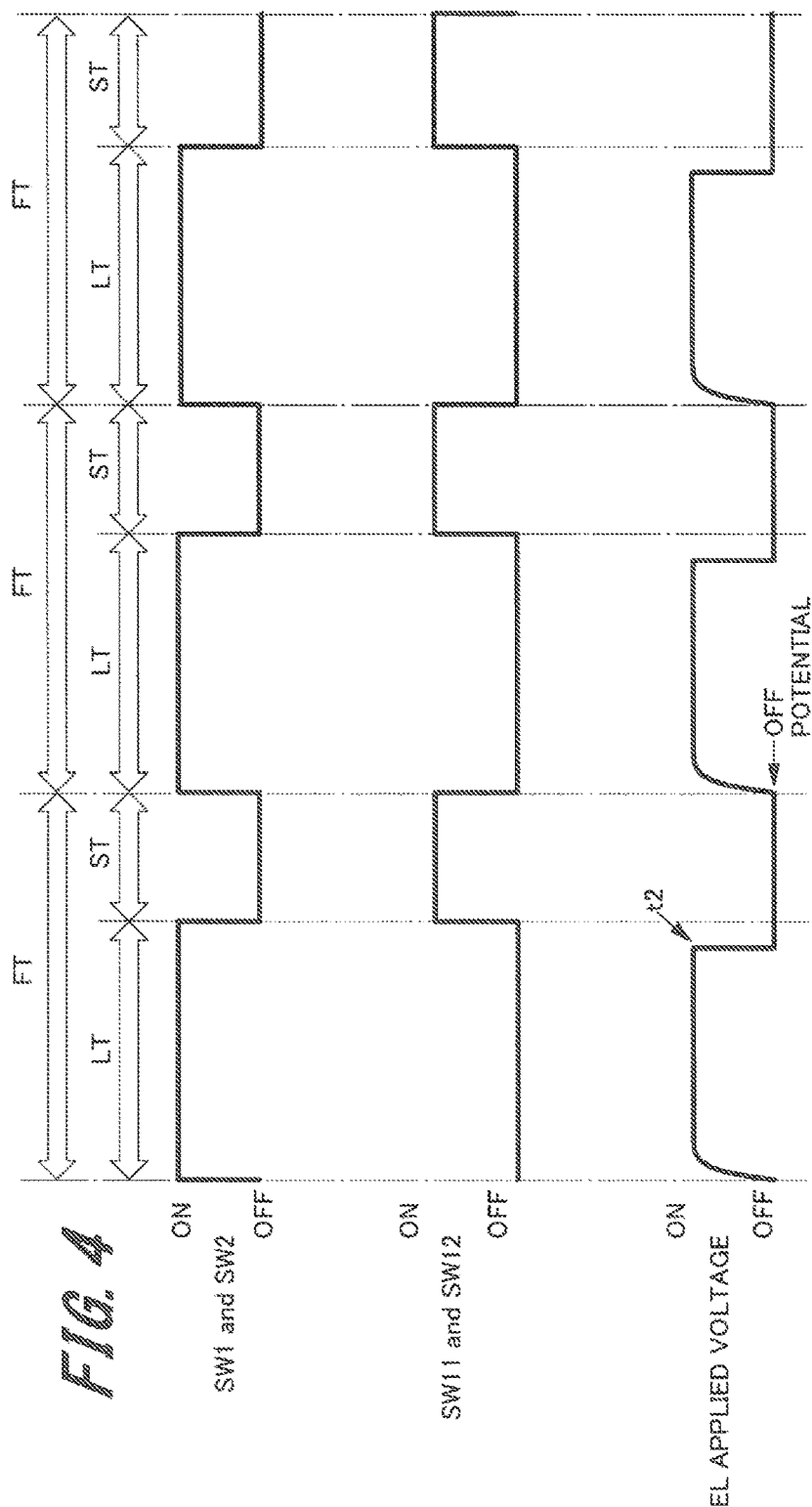
FIG. 4 is a timing chart for explaining an operation (second example) of the organic electroluminescent module of the first embodiment.

FIG. 4 is a timing chart illustrating a second example of the operation of the organic electroluminescent module 1 configured as described above. The difference of the second example illustrated in FIG. 4 from the first example illustrated in FIG. 3 lies in that a reverse voltage is applied to the organic electroluminescent device EL at the last timing t2 of the light-emitting period LT.

In the following, the second example of the operation of the organic electroluminescent module 1 will be described referring to FIGS. 1 and 2, on the basis of the timing chart of FIG. 4. Note that, a part of duplicate explanation of operations similar to those of the first example will be omitted.

As illustrated in FIG. 4, similarly to the first example, the operation period of the organic electroluminescent module repeatedly includes, alternately appearing in each single-frame period FT, the light-emitting period LT during which the organic electroluminescent device EL emits light and the touch-position detection period ST during which the touch-position detection is performed. The following driving is performed during each period.

—Light-Emitting Period LT—

In the second example, the luminescence driving circuit 21 of the luminescent-device driving circuit unit 20 applies a reverse voltage to the organic electroluminescent device EL at the last timing t2 of the light-emitting period LT. On this occasion, the switches SW1 and SW2 of the luminescent-device driving circuit unit 20 are kept "ON", the switches SW11 and SW12 of the touch-position detection circuit unit 30 are kept "OFF". Accordingly, the organic electroluminescent device EL immediately drops to the "OFF" potential at which discharge is completed, and goes out.

—Touch-Position Detection Period ST—

In the second example, the touch-position detection circuit unit 30 turns the switches SW11 and SW12 "ON" in synchronization with the start of the touch-position detection period ST. At the time point of starting the touch-position detection period ST, the organic electroluminescent device EL is at the "OFF" potential due to application of a reverse voltage. Accordingly, it is possible to perform a stabilized touch-position detection at the time point of starting the touch-position detection period ST without the need of the waiting period t1 (see FIG. 3) provided in the first example even when the switches SW11 and SW12 are turned "ON".

<Effect of First Embodiment>

The organic electroluminescent module 1 of the first embodiment described above is capable of performing one-dimensional touch-position detection by using the lower electrode 11 of the organic electroluminescent device EL as the detection electrode Ed and measuring the current value at both ends in the touch-position detection direction x thereof. Accordingly, it is not necessary to provide a touch sensor as a separately member on the organic electroluminescent device EL in an overlaid manner, and therefore an organic electroluminescent module with a touch function can be obtained which has achieved thinning of devices and reduction of production hours.

Furthermore, the organic electroluminescent module 1 of the first embodiment described above is configured to separate the touch-position detection period ST and the light-emitting period LT of the organic electroluminescent device EL, and disconnect the connection between the upper electrode 15 of the organic electroluminescent device EL and the luminescent-device driving circuit unit 20 during the touch-position detection period ST. Accordingly, the upper electrode 15 being used as the counter electrode Eo against the detection electrode Ed turns out to be a floating potential during the touch-position detection period ST, and the parasitic capacitance Cel can be completely canceled after the electric discharge time constant τ of the organic electroluminescent device EL has expired.

Here, the parasitic capacitance Cel between the lower electrode 11 and the upper electrode 15 of the organic electroluminescent device EL is several orders of magnitude larger than the capacitance Cf between the finger-tip F which has touched the touch surface 10*a* and the detection electrode Ed. Then, the capacitance C detected at the detection electrode Ed when the finger-tip F touches the touch surface 10*a* turns out to be "Cf+Cel", which is a sum of the capacitance Cf between the finger-tip F and the detection electrode Ed, and the parasitic capacitance Cel between the lower electrode 11 and the upper electrode 15 of the organic electroluminescent device EL, with the organic electroluminescent device EL and the luminescence driving circuit 21 being connected. Therefore, it has been difficult to detect the capacitance Cf between the finger-tip F and the detection electrode Ed, and detection of the touch-position P has been difficult.

Accordingly, as has been described above, it becomes possible to perform detection of the touch-position P with a high precision by a configuration with separating the touch-position detection period and the light-emitting period and setting the upper electrode 15 to a floating potential during the touch-position detection period so as to cancel the parasitic capacitance Cel.

In addition, the organic electroluminescent module 1 of the first embodiment described above has been configured to disconnect the connection between the lower electrode 11 being used as the detection electrode Ed and the luminescent-device driving circuit unit 20 by turning the switch SW1 "OFF" during the touch-position detection period. Accordingly, during the touch-position detection period, it is possible to prevent the potential of the detection electrode Ed from being affected by parasitic capacitances that occur in respective parts of the luminescent-device driving circuit unit 20.

Therefore, it is possible to detect the capacitance Cf between the detection electrode Ed and the finger-tip F on the touch surface 10*a* with a high precision while using the lower electrode 11 which is a component of the organic electroluminescent device EL as the detection electrode Ed, which allows for improving the precision of touch-position detection.

Note that the first embodiment explained above has been configured to freely disconnect the connection to the luminescent-device driving circuit unit 20 by providing the switches SW1 and SW2 to the lower electrode 11 and the upper electrode 15 of the organic electroluminescent device EL. When, however, the potential of the detection electrode Ed is not easily affected by the luminescent-device driving circuit unit 20, there may be a configuration such that the switch SW2 is provided only to the counter electrode Eo against the detection electrode Ed, and the detection electrode Ed is always connected to the luminescent-device driving circuit unit 20.

Second Embodiment

Figure 5:
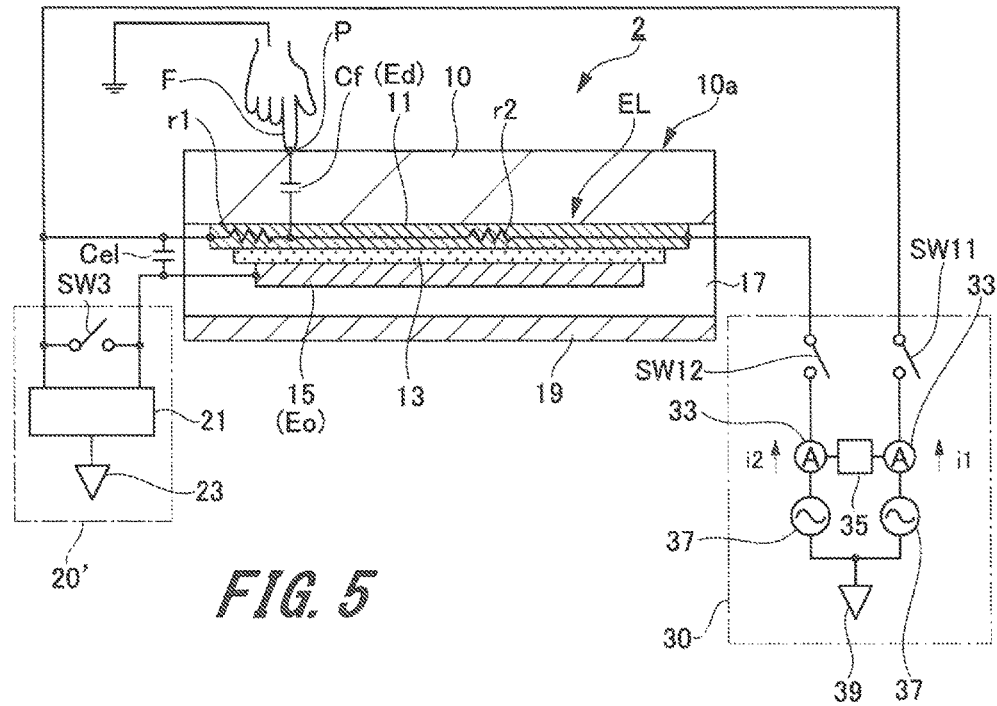
FIG. 5 is a configuration diagram for explaining an organic electroluminescent module of a second embodiment, the diagram describing a light-emitting period.

FIG. 5 is a configuration diagram for explaining an organic electroluminescent module 2 of a second embodiment. The difference of the organic electroluminescent module 2 of the second embodiment illustrated in the drawing from the organic electroluminescent module 1 of the first embodiment described referring to FIGS. 1 and 2 lies in the configuration of a luminescent-device driving circuit unit 20', with the rest of the configuration being similar to that of the first embodiment. Accordingly, the configuration of the luminescent-device driving circuit unit 20' will be described below, and duplicate explanation of other components will be omitted.

<Luminescent-Device Driving Circuit Unit 20'>

The luminescent-device driving circuit unit 20' controls luminescence from the organic electroluminescent device EL, and short-circuits the lower electrode 11 and the upper electrode 15 of the organic electroluminescent device EL. The luminescent-device driving circuit unit 20' described above includes the luminescence driving circuit 21 connected to the lower electrode 11 and the upper electrode 15 of the organic electroluminescent device EL, and a switch SW3 for short-circuiting the lower electrode 11 and the upper electrode 15. The luminescence driving circuit 21 is connected to the ground 23, the configuration thereof being similar to that of the first embodiment. The configuration of the switch SW3 is as follows.

—Switch SW3—

The switch SW3 is provided for freely controlling the connection state between the lower electrode 11 and the upper electrode 15. The switch SW3 described above includes for example a thin film transistor (TFT) and a control circuit which controls its driving. In this case the switch SW3 is configured such that either the source or the drain of the TFT is connected to the lower electrode 11 and the other is connected to the upper electrode 15, with the gate electrode of the TFT being connected to the control circuit. Accordingly, application of a voltage to the gate electrode of the TFT allows for freely controlling the connection state between the lower electrode 11 and the upper electrode 15.

Here, a state in which the lower electrode 11 and the upper electrode 15 are connected and short-circuited due to driving of the switch SW3 is referred to as the switch SW3 being turned "ON". In contrast, a state in which the connection between the lower electrode 11 and the upper electrode 15 is disconnected due to driving of the switch SW3 is referred to as the switch SW3 being turned "OFF".

The aforementioned control of turning the switch SW3 "ON" or "OFF" is performed in synchronization with the driving of the switches SW11 and SW12 of the touch-position detection circuit unit 30, as will be described in the following timing chart. In other words, the switch SW3 turns "OFF" when the switches SW11 and SW12 are "OFF" (see FIG. 5). On the other hand the switch SW3 turns "ON" (see FIG. 6) when the switches SW11 and SW12 are "ON".

Figure 6:
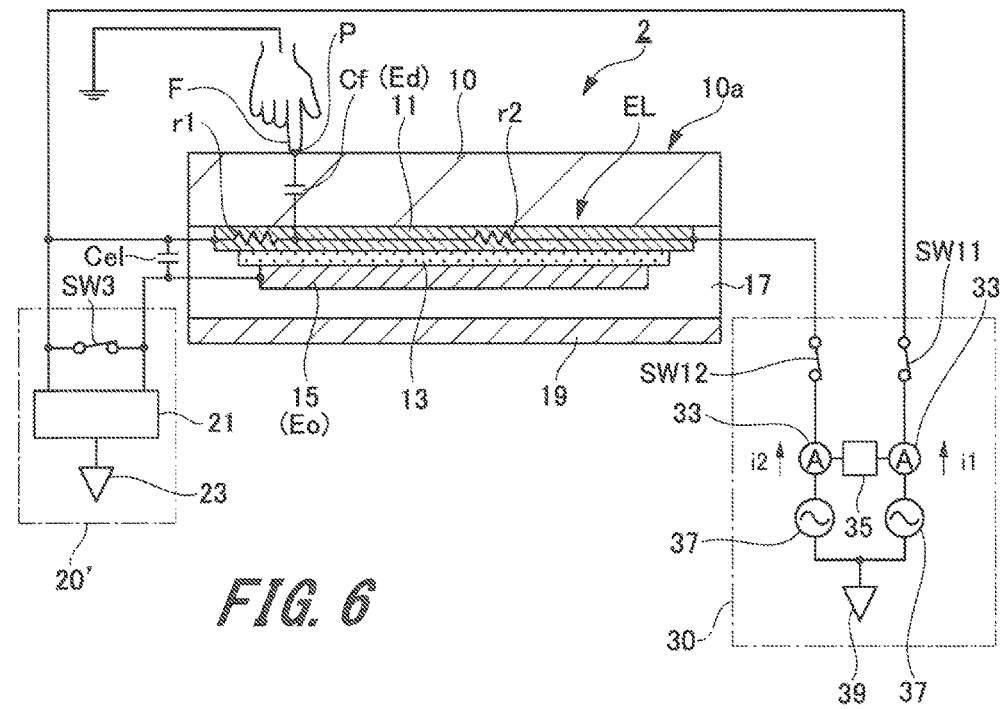
FIG. 6 is a configuration diagram for explaining a touch-position detection period in the second embodiment.

Note that, although the luminescence driving circuit 21 and the switch SW3 are illustrated in FIGS. 5 and 6 as being configured independently of each other, there may be a configuration such that the switch SW3 is built in the luminescence driving circuit 21 as necessary. In addition, the control circuit of the switch SW3 may be an external arithmetic operation apparatus.

<Operation Example of Organic Electroluminescent Module 2>

Figure 7:
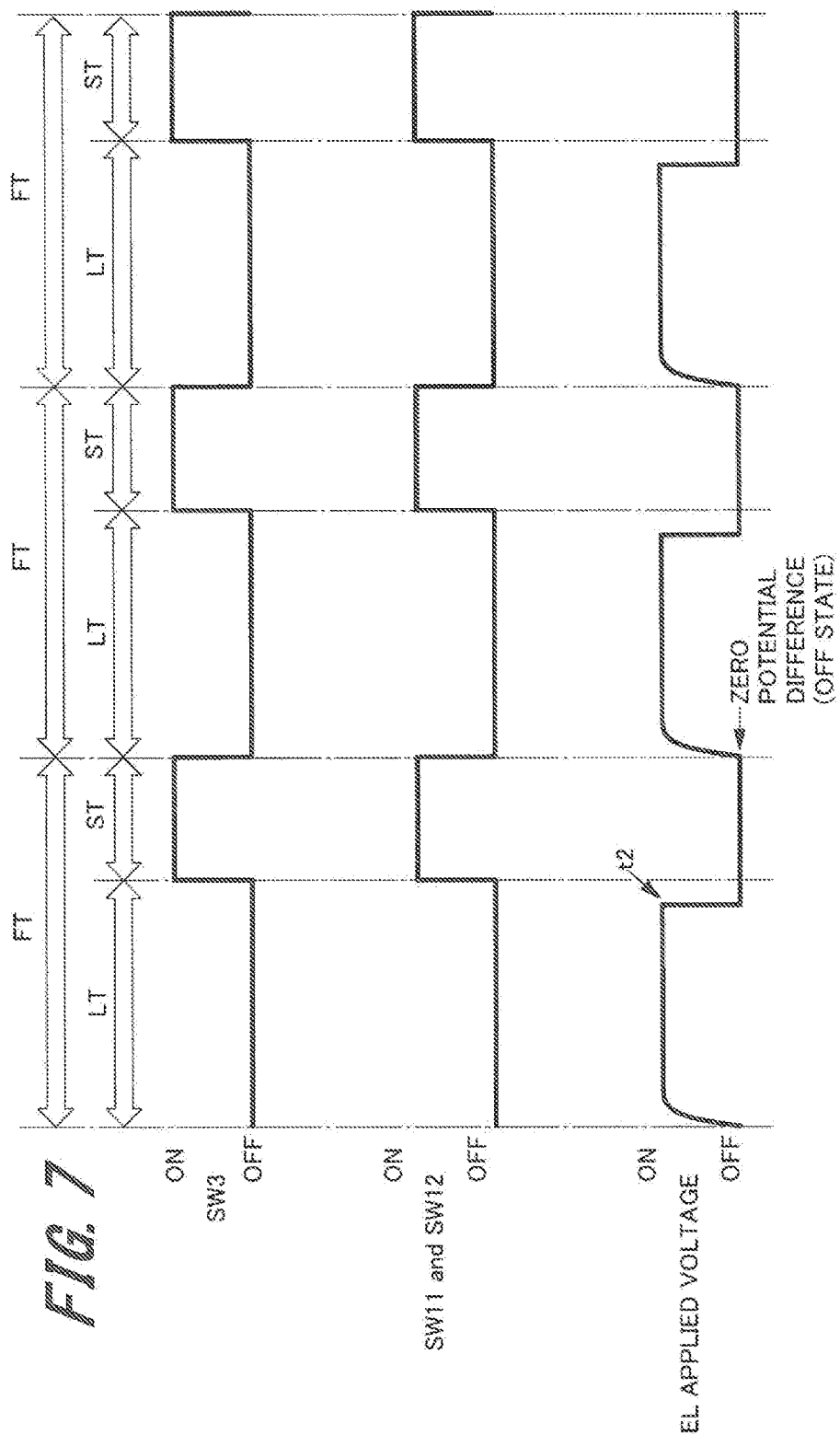
FIG. 7 is a timing chart for explaining an operation of the organic electroluminescent module of the second embodiment.

FIG. 7 is a timing chart illustrating an operation example of the organic electroluminescent module 2 configured as described above, the chart describing the operation of the organic electroluminescent module 2 performed by the luminescent-device driving circuit unit 20' and the touch-position detection circuit unit 30.

In the following, the operation example of the organic electroluminescent module 2 will be described referring to FIGS. 5 and 6, on the basis of the timing chart of FIG. 7.

Similarly to the first embodiment, the operation period in the organic electroluminescent module 2 repeatedly includes, alternately in each single-frame period FT, the light-emitting period LT during which the organic electroluminescent device EL emits light and the touch-position detection period ST during which the touch-position detection is performed. The lengths of the single-frame period FT, the light-emitting period LT, and the touch-position detection period ST are similar to those of the first embodiment.

—Light-Emitting Period LT—

During the light-emitting period LT assigned to the first half of the single-frame period FT, the luminescent-device driving circuit unit 20' turns the switch SW3 "OFF". In addition, the touch-position detection circuit unit 30 turns the switches SW11 and SW12 "OFF".

Accordingly, as illustrated in FIG. 5, the lower electrode 11 and the upper electrode 15 of the organic electroluminescent device EL are connected to the luminescence driving circuit 21, keeping the insulated state, in the luminescent-device driving circuit unit 20'. Therefore, luminescence control of the organic electroluminescent device EL by the luminescence driving circuit 21 becomes possible. Here, the luminescence driving circuit 21 applies a constant current or a constant voltage to the organic electroluminescent device EL in the forward direction in synchronization with turning the switch SW3 "OFF". Accordingly, the applied voltage of the organic electroluminescent device EL rises from the "OFF" potential as illustrated in the lower part of FIG. 7, and luminescence is started at the time point when the current value or the voltage value required for luminescence is reached.

On the other hand, in the touch-position detection circuit unit 30, the connected state between the detection electrode Ed and the ammeters 33 is disconnected in order to turn the switches SW11 and SW12 "OFF", whereby it is impossible to detect the touch-position P.

In addition, as illustrated in FIG. 7, the luminescence driving circuit 21 of the luminescent-device driving circuit unit 20' applies a same potential to the lower electrode 11 and the upper electrode 15 at the last timing t2 of the light-emitting period LT. Accordingly, the lower electrode 11 and the upper electrode 15 turn "OFF" with a "zero" potential difference and the organic electroluminescent device EL goes out.

—Touch-Position Detection Period ST—

As illustrated in FIG. 7, during the touch-position detection period ST assigned to the latter half of the single-frame period FT, the luminescent-device driving circuit unit 20' turns the switch SW3 "ON" in synchronization with the start of the period. In addition, the touch-position detection circuit unit 30 turns the switches SW11 and SW12 "ON" in synchronization with the start of the period. Furthermore, the luminescent-device driving circuit unit 20' keeps applying a same potential to the lower electrode 11 and the upper electrode 15.

Accordingly, as illustrated in FIG. 6, the lower electrode 11 and the upper electrode 15 of the organic electroluminescent device EL are short-circuited in the luminescent-device driving circuit unit 20'. Therefore, luminescence control of the organic electroluminescent device EL by the luminescence driving circuit 21 becomes impossible. In addition, as illustrated in the lower part of FIG. 7, the lower electrode 11 and the upper electrode 15 of the organic electroluminescent device EL are "OFF" with a "zero" potential difference, whereby the gone-out state of the organic electroluminescent device EL is maintained.

On the other hand, in the touch-position detection circuit unit 30, the detection electrode Ed and the ammeters 33 are brought into a connected state, making it possible to perform touch-position detection on the basis of the current value measured by the ammeters 33. Here, at the time point of starting the touch-position detection period ST, the potential difference between the lower electrode 11 and the upper electrode 15 of the organic electroluminescent device EL is "zero" as described above, and the parasitic capacitance Cel of the organic electroluminescent device EL has been canceled. Accordingly, it is possible to perform a stabilized touch-position detection at the time point of starting the touch-position detection period ST without the need of the waiting period t1 (see FIG. 3) provided in the first example of the first embodiment even when the switch SW3 is turned "ON".

Note that the second embodiment described above has employed a configuration providing the switch SW3 between the lower electrode 11 and the upper electrode 15 of the organic electroluminescent device EL so as to freely control the connection state between the lower electrode 11 and the upper electrode 15. However, it is not necessary to provide the switch SW3 in a case where the potential of the detection electrode Ed included in the lower electrode 11 is sufficiently stabilized by setting a "zero" potential difference between the lower electrode 11 and the upper electrode 15 to cancel the parasitic capacitance Cel of the organic electroluminescent device EL. In this case, it suffices that the luminescent-device driving circuit unit 20' is configured to only perform control of the applied voltage to the lower electrode 11 and the upper electrode 15 by the luminescence driving circuit 21, as has been explained referring to FIG. 7 on the basis of the foregoing operation example.

<Effect of Second Embodiment>

The organic electroluminescent module 2 of the second embodiment described above is also capable of, similarly to the first embodiment, performing one-dimensional touch-position detection by using the lower electrode 11 of the organic electroluminescent device EL as the detection electrode Ed, and therefore turns out to be an organic electroluminescent module with a touch function which has achieved thinning of devices and reduction of production hours.

In addition, the organic electroluminescent module 2 of the second embodiment is configured to separate the touch-position detection period and the light-emitting period of the organic electroluminescent device EL, and short-circuit the upper electrode 15 and the lower electrode 11 of the organic electroluminescent device EL during the touch-position detection period. Accordingly, the parasitic capacitance Cel of the organic electroluminescent device EL is canceled during the touch-position detection period. Therefore, similarly to the first embodiment, it is possible to improve the precision of touch-position detection without being affected by the parasitic capacitance Cel of the organic electroluminescent device EL while using the lower electrode 11 which is a component of the organic electroluminescent device EL as the detection electrode Ed.

<Combination with Configuration of Second Embodiment>

Figure 8:
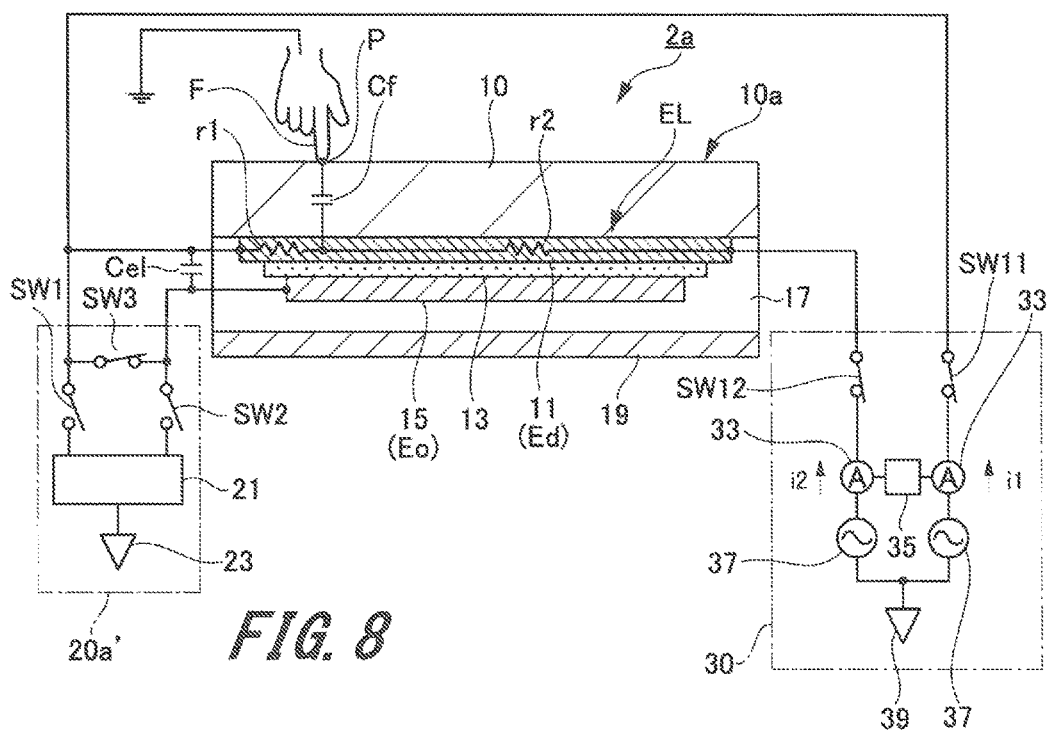
FIG. 8 is a configuration diagram for explaining an organic electroluminescent module resulting from combining the second embodiment and the first embodiment, the diagram describing a light-emitting period.

The configuration of the organic electroluminescent module 2 of the second embodiment can be combined with the configuration of the first embodiment. FIG. 8 is a configuration diagram for explaining an organic electroluminescent module 2a resulting from combining the second embodiment and the first embodiment, the diagram describing the touch-position detection period.

As illustrated in FIG. 8, a luminescent-device driving circuit unit 20a' of the organic electroluminescent module 2a resulting from combining the second embodiment and the first embodiment includes, together with the luminescence driving circuit 21 and the switch SW3, the switch SW1 provided between the luminescence driving circuit 21 and the lower electrode 11, and the switch SW2 provided between the luminescence driving circuit 21 and the upper electrode 15.

The configuration and "ON"/"OFF" control of the switch SW3 are similar to those of the second embodiment, whereas the configuration and "ON"/"OFF" control of the switches SW1 and SW2 are similar to those of the first embodiment, both being respectively driven in synchronization.

The organic electroluminescent module 2a configured as described above brings about the effect of the first embodiment, in addition to the effect of the second embodiment.

In other words, it is possible to completely cancel the parasitic capacitance Cel during the touch-position detection period, by turning the switch SW2 "OFF" to set the upper electrode 15 being used as the counter electrode Eo against the detection electrode Ed to a floating potential. In addition, it is possible to prevent the potential of the detection electrode Ed from being affected by the parasitic capacitances that occur in respective parts of the luminescence driving circuit 21 during the touch-position detection period, by turning the switch SW1 "OFF" to disconnect the connection between the lower electrode 11 being used as the detection electrode Ed and the luminescent-device driving circuit unit 20a'.

Therefore, it is possible to detect the capacitance Cf between the detection electrode Ed and the finger-tip F on the touch surface 10a with a high precision while using the lower electrode 11 which is a component of the organic electroluminescent device EL as the detection electrode Ed, which allows for improving the precision of touch-position detection.

Note that the configuration described above may be such that, in a case where the potential of the detection electrode Ed is not easily affected by the luminescent-device driving circuit unit 20a', the switch SW2 is only provided on the counter electrode Eo against the detection electrode Ed, and the detection electrode Ed is always connected to the luminescent-device driving circuit unit 20a'. This is similar to the first embodiment.

Additionally, in such a configuration, a same potential may be applied to the lower electrode 11 and the upper electrode 15 from the luminescent-device driving circuit unit 20a' at the last timing t2 of the light-emitting period LT, similarly to the second embodiment. In addition, when a same potential is not applied at the last timing t2, it is preferred to provide the waiting period t1 within the touch detection period ST, similarly to the first example of the first embodiment.

Third Embodiment

Figure 9:
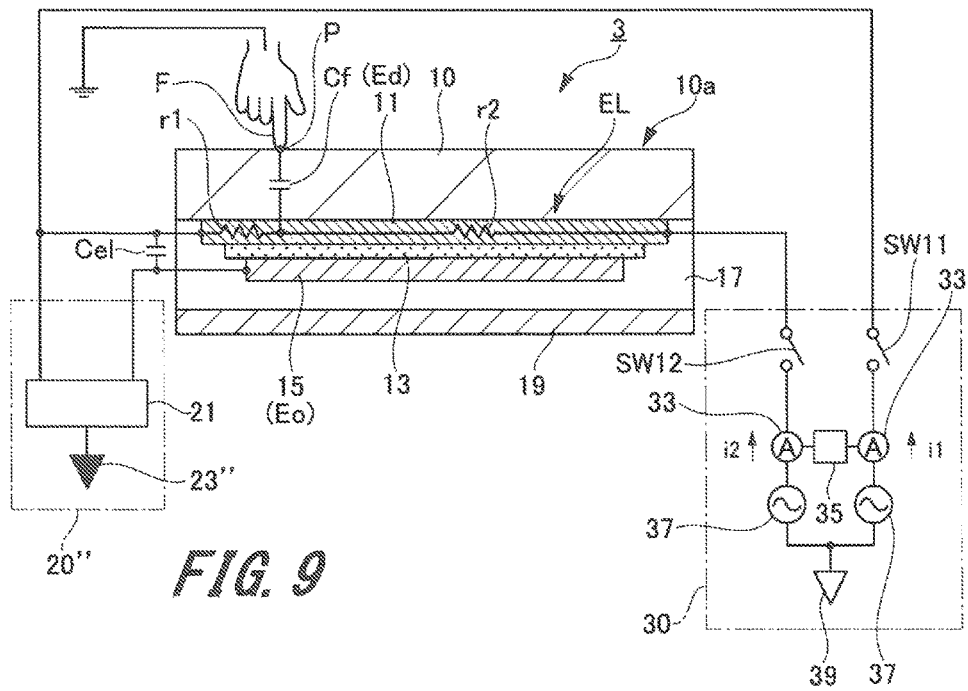
FIG. 9 is a configuration diagram for explaining an organic electroluminescent module of a third embodiment, the diagram describing a light-emitting period.

FIG. 9 is a configuration diagram for explaining an organic electroluminescent module 3 of a third embodiment. The difference of the organic electroluminescent module 3 of the third embodiment illustrated in the drawing from the organic electroluminescent module 1 of the first embodiment described referring to FIGS. 1 and 2 lies in the configuration of a luminescent-device driving circuit unit 20", with the rest of the configuration being similar to that of the first embodiment. Accordingly, the configuration of the luminescent-device driving circuit unit 20" will be described below, and duplicate explanation of other components will be omitted.

<Luminescent-Device Driving Circuit Unit 20">

The luminescent-device driving circuit unit 20" controls luminescence from the organic electroluminescent device EL. The luminescent-device driving circuit unit 20" includes the luminescence driving circuit 21 connected to the lower electrode 11 and the upper electrode 15 of the organic electroluminescent device EL. The configuration of the luminescence driving circuit 21 is similar to that of the first embodiment. The luminescence driving circuit 21 is connected to a ground 23" described below.

—Ground 23"—

The ground 23" may be a signal ground formed with a circuit pattern, or may be a frame ground such as a metal case in which the organic electroluminescent module 3 is provided. What is particularly important here is that the ground is different from the ground 39 at the touch-position detection circuit unit 30 side.

<Operation Example of Organic Electroluminescent Module 3>

Figure 11:
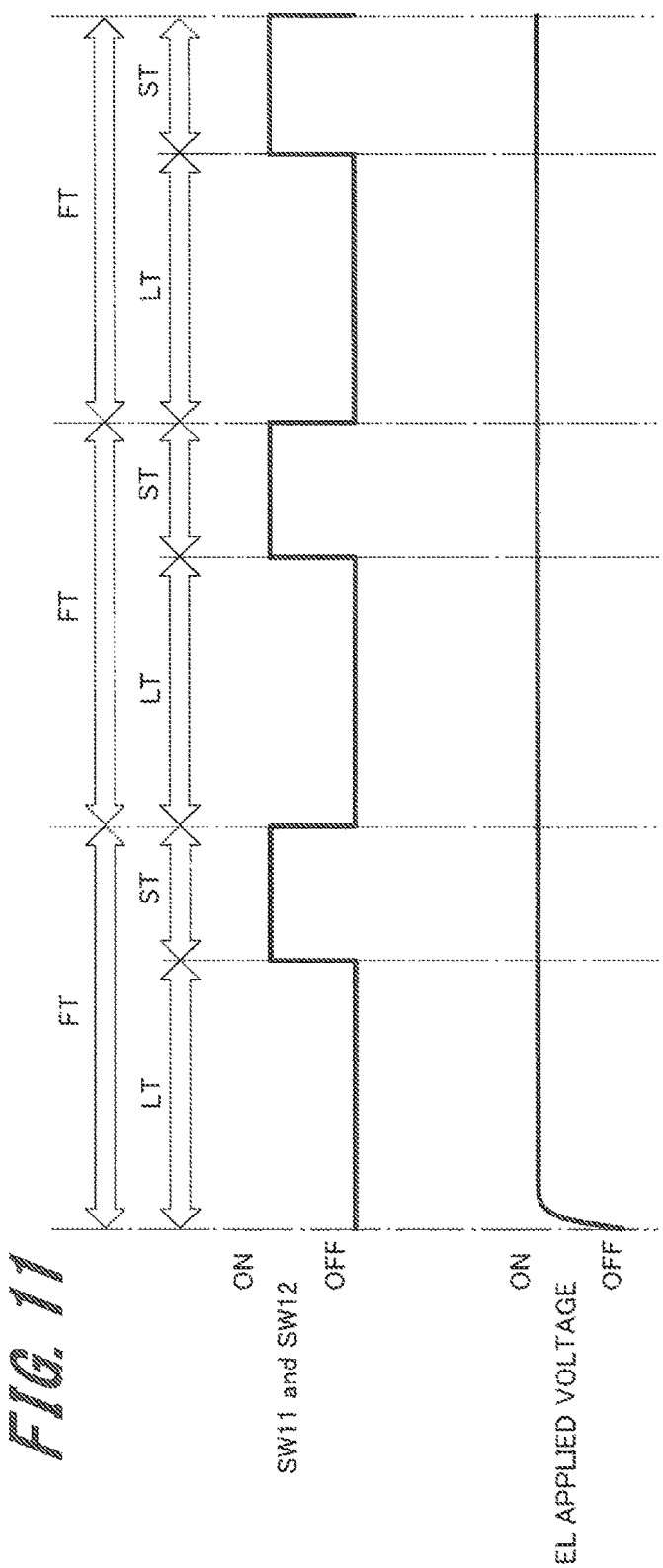
FIG. 11 is a timing chart for explaining an operation example of the organic electroluminescent module of the third embodiment.

FIG. 11 is a timing chart illustrating an operation example of the organic electroluminescent module 3 configured as described above, the chart describing the operation of the organic electroluminescent module 3 performed by the luminescent-device driving circuit unit 20" and the touch-position detection circuit unit 30.

In the following, the operation example of the organic electroluminescent module 3 will be described referring to FIGS. 9 and 10, on the basis of the timing chart of FIG. 11.

The organic electroluminescent module 3 causes the organic electroluminescent device EL to emit light continuously during the operation period. During the continuous light-emitting period, the organic electroluminescent module 3 then provides the touch-position detection period ST to cyclically perform touch-position detection. The touch-position detection period ST cyclically appears in each single-frame period FT. Accordingly, for example the first half of the single-frame period FT turns out to be the light-emitting period LT during which only emission from the organic electroluminescent device EL is performed without performing touch-position detection, whereas the latter half turns out to be the touch-position detection period ST during which touch-position detection is performed. The lengths of the single-frame period FT, the light-emitting period LT, and the touch-position detection period ST are similar to those of the first embodiment.

—Light-Emitting Period LT—

During the light-emitting period LT assigned to the first half of the single-frame period FT, the touch-position detection circuit unit 30 turns the switches SW11 and SW12 "OFF".

During the light-emitting period LT described above, luminescence control of the organic electroluminescent device EL by the luminescence driving circuit 21 is possible, as illustrated in FIG. 9. Accordingly, as illustrated in the lower part of FIG. 11, the applied voltage of the organic electroluminescent device EL rises from the "OFF" potential immediately after the driving period is started, whereby luminescence is started at the time point when a current value or a voltage value required for luminescence is reached.

On the other hand, the touch-position detection circuit unit 30 disconnects the connected state between the detection electrode Ed and the ammeters 33, whereby it is impossible to detect the touch-position P.

—Touch-Position Detection Period ST—

As illustrated in FIG. 11, the touch-position detection circuit unit 30 turns the switches SW11 and SW12 "ON" during the touch-position detection period ST assigned to the latter half of the single-frame period FT.

Figure 10:
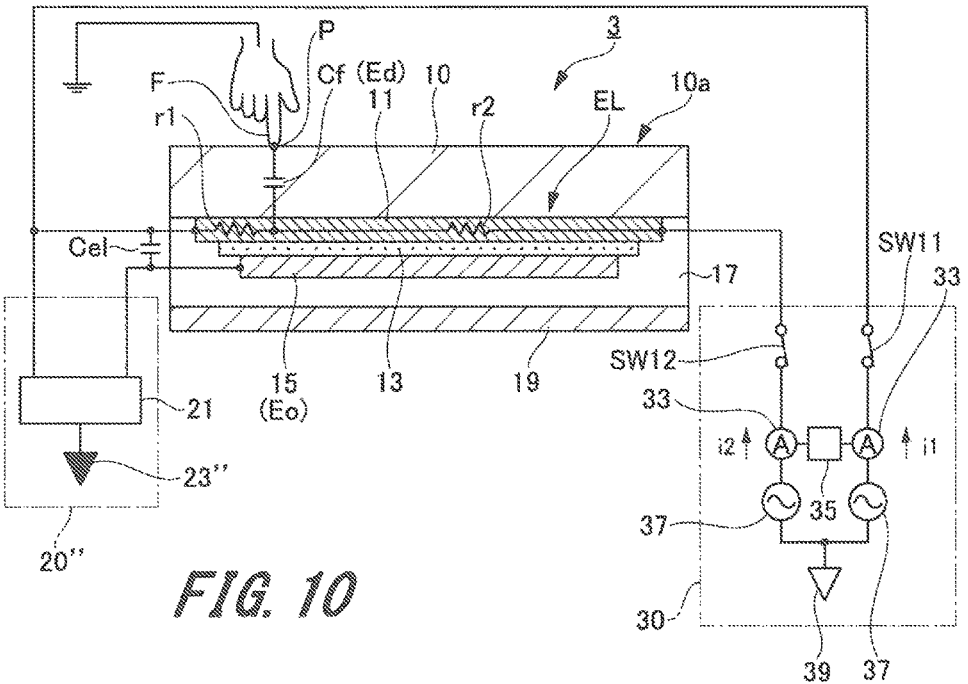
FIG. 10 is a configuration diagram for explaining a touch-position detection period in the third embodiment.

During the touch-position detection period ST described above, luminescence control of the organic electroluminescent device EL by the luminescence driving circuit 21 is still possible as illustrated in FIG. 10, whereby the light emitting state of the organic electroluminescent device EL is maintained as illustrated in the lower part of FIG. 11.

On the other hand, in the touch-position detection circuit unit 30, the switches SW11 and SW12 turn "ON" so that the detection electrode Ed and the ammeters 33 are brought into a connected state, making it possible to perform detection of the touch-position P on the basis of the current value measured by the ammeters 33.

<Effect of Third Embodiment>

The organic electroluminescent module 3 of the third embodiment described above is also capable of, similarly to the first embodiment, performing one-dimensional touch-position detection by using the lower electrode 11 of the organic electroluminescent device EL as the detection electrode Ed, and therefore turns out to be an organic electroluminescent module with a touch function which has achieved thinning of devices and reduction of production hours.

In addition, the organic electroluminescent module 3 of the third embodiment is configured such that the luminescence driving circuit 21 of the luminescent-device driving circuit unit 20" for driving the organic electroluminescent device EL is connected to the ground 23" which is different from that of the touch-position detection circuit unit 30 connected to the detection electrode Ed. Accordingly, it is possible to improve the precision of touch-position detection, without the parasitic capacitance Cel of the organic electroluminescent device EL affecting the capacitance Cf between the detection electrode Ed including the lower electrode 11 and the finger-tip F on the touch surface 10a.

<Combination with Configuration of Third Embodiment>

The configuration of the organic electroluminescent module 3 of the third embodiment can be combined with the configuration of the first embodiment, combined with the configuration of the second embodiment, and further combined with the configurations of both the first and the second embodiments. When combined, an aggregate effect of the combined embodiments can be obtained.

Fourth Embodiment

Figure 12:
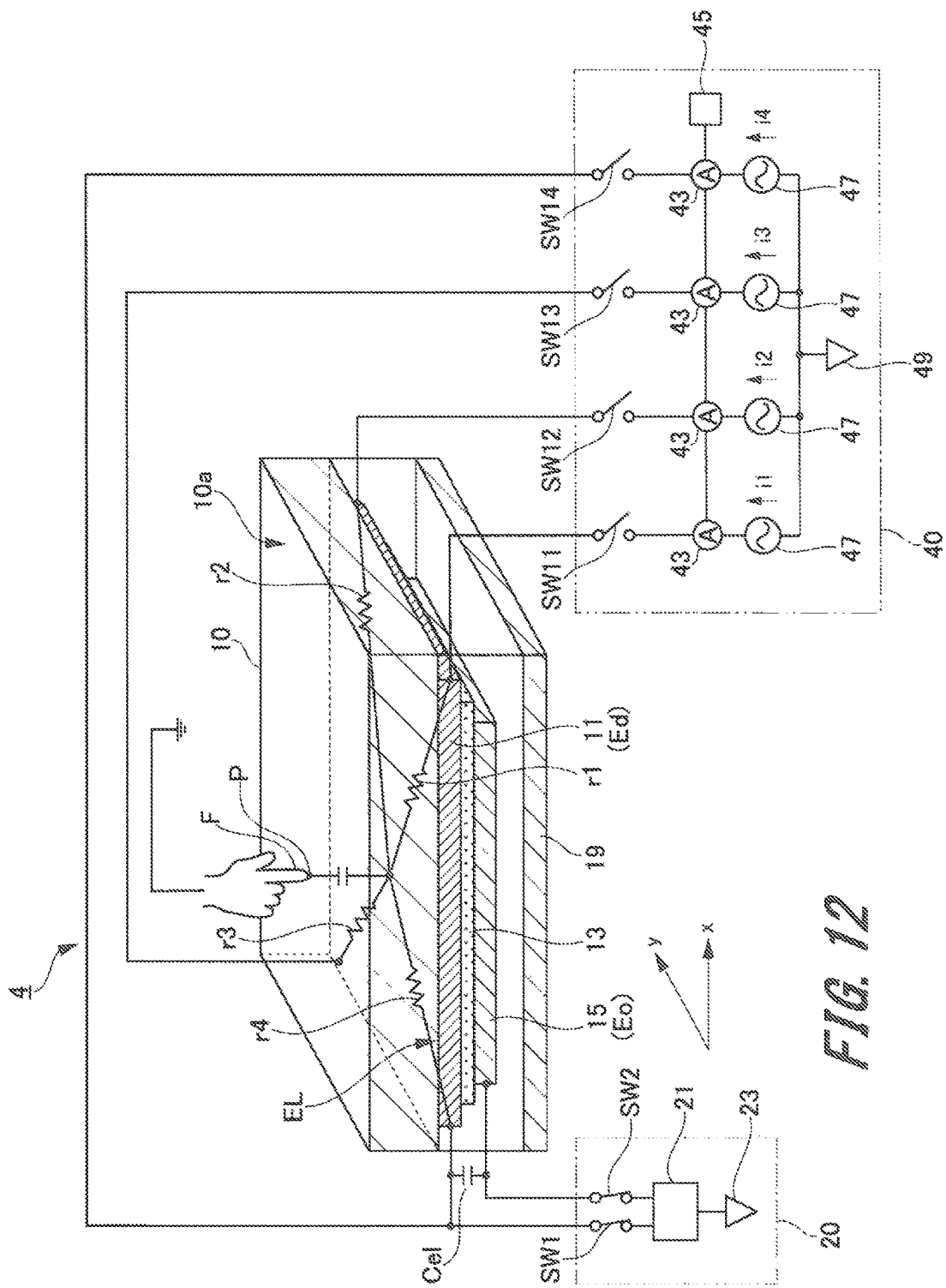
FIG. 12 is a configuration diagram for explaining an organic electroluminescent module of a fourth embodiment.

FIG. 12 is a configuration diagram for explaining an organic electroluminescent module 4 of a fourth embodiment. The difference of the organic electroluminescent module 4 of the fourth embodiment illustrated in the drawing from the organic electroluminescent module 1 of the first embodiment described referring to FIGS. 1 and 2 lies in the configuration of a touch-position detection circuit unit 40, with the rest of the configuration being similar to that of the first embodiment. Accordingly, the configuration of the touch-position detection circuit unit 40 will be described below, and duplicate explanation of other components will be omitted.

<Touch-Position Detection Circuit Unit 40>

The touch-position detection circuit unit 40 is connected to four corners including both ends of the detection electrode Ed in two-dimensional directions, with each of the two-dimensional directions on the detection electrode Ed being the touch-position detection directions x and y. Here, the detection electrode Ed, i.e., the lower electrode 11 of the organic electroluminescent device EL as an example here, is assumed to be planar quadrangular. The touch-position detection circuit unit 40 is thus assumed to be connected to the four corners of the planar quadrangular detection electrode Ed. The touch-position detection circuit unit 40 detects the touch-position P in the two-dimensional touch-position detection directions x and y on the detection electrode Ed, by detecting the electrical characteristics in the four corners of the detection electrode Ed.

The touch-position detection circuit unit 40 described above includes switches SW11 to SW14 connected to the four corners of the detection electrode Ed, four ammeters 43 connected to each of the switches SW11 to SW14, an arithmetic operation unit 45 connected to each of the ammeters 43, and a power source 47. The power source 47 is connected to a ground 49.

—Switches SW11 to SW14—

The switches SW11 to SW14 are provided to freely control the connection state between the four corners of the detection electrode Ed and each of the ammeters 43. The switches SW11 to SW14 described above respectively include, for example, a thin film transistor (TFT) and a control circuit which controls its driving. The switches SW11 to SW14 in this case are configured such that either the source or the drain of the TFT is connected to the four corners of the detection electrode Ed and the other is connected to the ammeters 43, with the gate electrode of the TFT being connected to the control circuit. Accordingly, applied voltage to the gate electrode of the TFT allows for freely controlling the connection state between each of the four corners of the detection electrode Ed and each of the ammeters 43.

A state in which the four corners of the detection electrode Ed and each of the ammeters 43 are connected due to driving of the switches SW11 to SW14 as described above is referred to as the switches SW11 to SW14 being turned "ON". In contrast, a state in which connection between the detection electrode Ed and the ammeters 43 is disconnected due to driving of the switches SW11 to SW14 is referred to as the switches SW11 to SW14 being turned "OFF".

The switches SW11 to SW14 are driven in synchronization with the switches SW1 and SW2 of the luminescent-device driving circuit unit 20, and the switches SW11 to SW14 turn "OFF" when the switches SW1 and SW2 are "ON". On the other hand, the switches SW11 to SW14 turn "ON" when the switches SW1 and SW2 are "OFF". Note that the control circuit of the switches SW11 to SW14 may be an external arithmetic operation apparatus.

—Ammeters 43—

The ammeters 43 respectively measure current flowing in the four corners of the detection electrode Ed.

—Arithmetic Operation Unit 45—

The arithmetic operation unit 45 calculates, from four current values i1 to i4 measured by the four ammeters 43, a position on which a touch operation has been performed in a touch-position detection direction on the touch surface 10*a* of the detection electrode Ed. Here, as in formulas (2) and (3), a touch-position in the touch-position detection directions x and y of the detection electrode Ed is obtained from the current values i1 to i4. In other words, the position in the touch-position detection direction x of the touch-position P is calculated from a ratio of the sum of the current values i2 and i3 (or the current values i1 and i4) measured at both ends of the touch-position detection direction x against the sum of the current values i1 to i4 measured at the four corners. In addition, the position of the touch-position P in the touch-position detection direction y is calculated from the ratio of the sum of current values i1 and i2 (or the current values i3 and i4) measured at both ends in touch-position detection direction y against the sum of the current values i1 to i4 measured at the four corners.

$$x = k1 + k2 \times [(i2+i3)/(i1+i2+i3+i4)] \qquad \text{formula (2)}$$

$$y = k1 + k2 \times [(i1+i2)/(i1+i2+i3+i4)] \qquad \text{formula (3)}$$

Herein, in formulas (2) and (3), k1 is an offset and k2 is a magnification factor, whose values being unique to the design of respective organic electroluminescent modules 4; ideally the offset k1 and the magnification k2 are given as k1=0 and k2=1.

—Power Source 47—

The power source 47 may be either an alternating-current power source or a direct-current power source, provided that it is capable of applying a predetermined voltage.

—Ground 49—

The ground 49 may be a signal ground formed with a circuit pattern, or may be a frame ground such as a metal case in which the organic electroluminescent module 4 is provided.

<Operation of Organic Electroluminescent Module 4>

Driving of the organic electroluminescent module 4 configured as described above is performed similarly to the first and the second examples of the operation described in the first embodiment. In this case, it suffices to replace the switches SW11 and SW12 appearing in the description of operation in the first embodiment by the switches SW11 to SW14.

<Effect of Fourth Embodiment>

The organic electroluminescent module 4 of the fourth embodiment as described above, having a touch function capable of touch-position detection in two-dimensional directions, can bring about an effect similar to that of the first embodiment.

<Combination with Configuration of Fourth Embodiment>

The configuration of the organic electroluminescent module 4 of the fourth embodiment can be combined with the configuration of the second embodiment, combined with the configuration of the third embodiment, and further combined with the configurations of both the second and the third embodiments. In this case, it suffices to replace the luminescent-device driving circuit unit 20 illustrated in FIG. 12 by the second embodiment or the third embodiment, or even by a luminescent-device driving circuit unit configured by a combination of the two, whereby effects unique to respective embodiments can be exhibited.

<<Application Example 1 of Organic Electroluminescent Module>>

Figure 13:
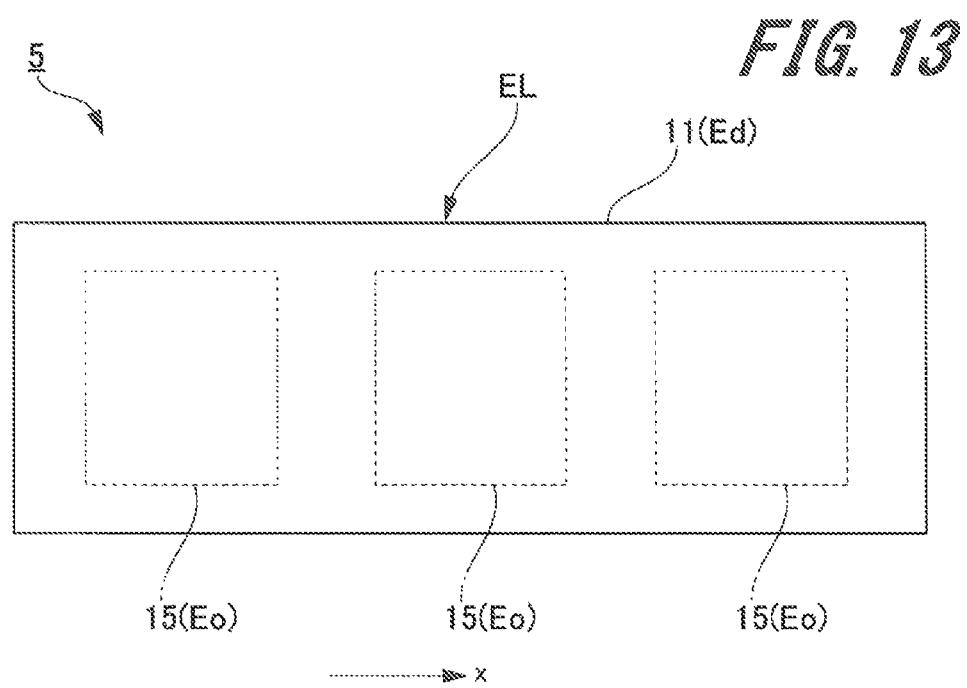
FIG. 13 is a plan view for explaining an application example 1 of the organic electroluminescent module of the present invention.

FIG. 13 is a plan view for explaining an application example 1 of an organic electroluminescent module. An organic electroluminescent module 5 illustrated in the drawing is configured such that, for example, the upper electrode 15 of the organic electroluminescent module 1 of the first embodiment described referring to FIG. 1 is divided into a plurality of pieces in the touch-position detection direction x. Here, a configuration with the upper electrode 15 being divided into three pieces in the touch-position detection direction x is illustrated as an example. Note that, FIG. 13 is a plan view looking at the organic electroluminescent module 5 from the detection electrode Ed side including the lower electrode 11, with illustration of the supporting substrate or the like being omitted.

The upper electrode 15 (the counter electrode Eo) divided as described above into three pieces, each being connected to a luminescent-device driving circuit unit which is not illustrated here, is configured to have a voltage individually applied to respective pieces. In contrast, the detection electrode Ed including the lower electrode 11 is configured such that both ends in the touch-position detection direction x are connected to the touch-position detection circuit unit which is not illustrated here.

Such a configuration allows the touch-position detection circuit unit to detect, for example, which of the upper electrodes 15 in the touch-position detection direction x the position on which a touch operation is performed corresponds to. Accordingly, the touch-position detection circuit unit is configured to feed back the detected touch-position P to the luminescence driving circuit of the luminescent-device driving circuit unit. Thus, the luminescence driving circuit is configured to apply a voltage for causing the organic electroluminescent device to emit light to the upper electrode 15 and the lower electrode 11 corresponding to the detected touch-position P, when causing the organic electroluminescent device to emit light. Accordingly, there can be a configuration to cause only the part corresponding to the touch-position P in the touch-position detection direction x to emit light.

Note that the organic electroluminescent module 5 may be configured such that the upper electrode 15 of the organic electroluminescent module 2 of the second embodiment described referring to FIG. 5, the upper electrode 15 of the organic electroluminescent module 2a described referring to FIG. 8, or the upper electrode 15 of the organic electroluminescent module 3 of the third embodiment described referring to FIG. 9 is divided into a plurality of pieces in the touch-position detection direction x.

<<Application Example 2 of Organic Electroluminescent Module>>

Figure 14:
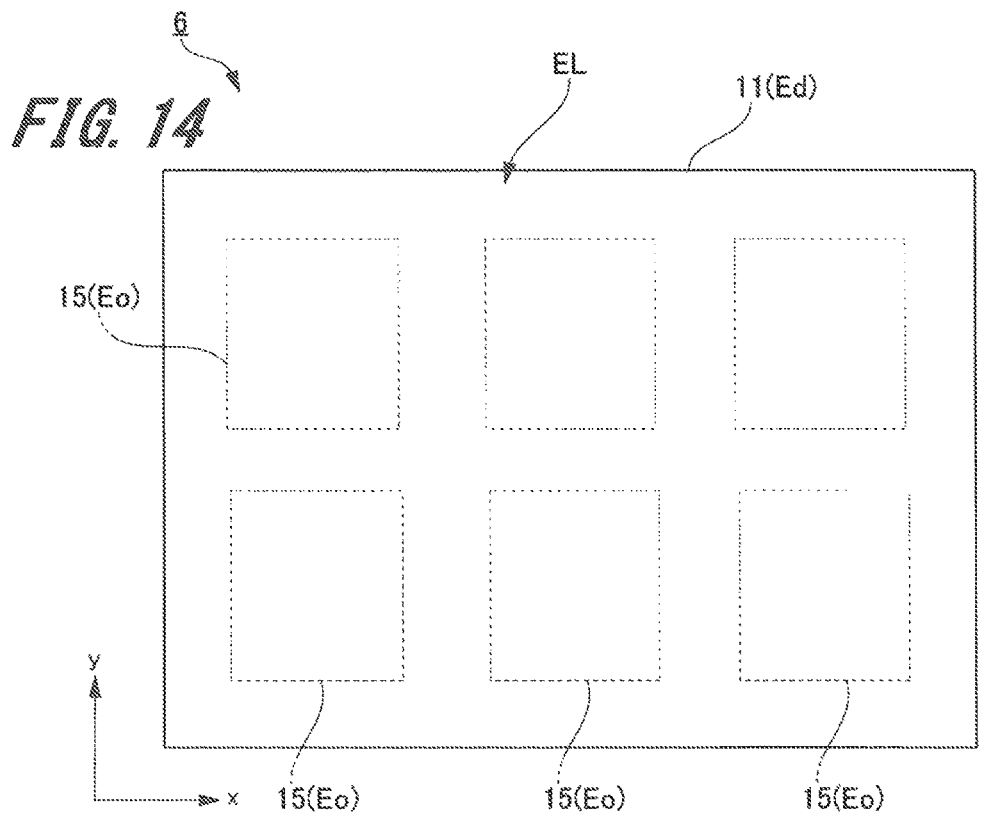
FIG. 14 is a plan view for explaining an application example 2 of the organic electroluminescent module of the present invention.

FIG. 14 is a plan view for explaining an application example 2 of an organic electroluminescent module. An organic electroluminescent module 6 illustrated in the drawing is configured such that, for example, the upper electrode 15 of the organic electroluminescent module 4 of the fourth embodiment described referring to FIG. 12 is divided into a plurality of pieces in the touch-position detection directions x and y. Here, a configuration with the upper electrode 15 being divided into three pieces in the touch-position detection direction x and two pieces in the touch-position detection direction y, i.e., six pieces in all, is illustrated as an example. Note that, FIG. 14 is a plan view looking at the organic electroluminescent module 6 from the detection electrode Ed side including the lower electrode 11, with illustration of the supporting substrate or the like being omitted.

The upper electrode 15 (the counter electrode Eo) divided as described above into six pieces, each being connected to the luminescent-device driving circuit unit which is not illustrated here, is configured to have a voltage individually applied to respective pieces. In contrast, the detection electrode Ed including the lower electrode 11 is configured such that the four corners in the touch-position detection directions x and y are connected to the touch-position detection circuit unit which is not illustrated here.

Such a configuration allows the touch-position detection circuit unit to detect, for example, which of the upper electrodes 15 in the touch-position detection directions x and y the position on which a touch operation is performed corresponds to. Accordingly, similarly to the application example 1, it is possible to provide a configuration to feed back the detected touch-position P to the luminescence driving circuit of the luminescent-device driving circuit unit and apply a voltage for causing the organic electroluminescent device to emit light from the luminescent-device driving circuit unit to the upper electrode 15 and the lower electrode 11 corresponding to the detected touch-position P so as to cause only the part corresponding to the touch-position to emit light.

Note that the organic electroluminescent module 6 may be configured such that the upper electrode 15 of the organic electroluminescent module 2 of the second embodiment described referring to FIG. 5, the upper electrode 15 of the organic electroluminescent module 2a described referring to FIG. 8, or the upper electrode 15 of the organic electroluminescent module 3 of the third embodiment described referring to FIG. 9 is divided into a plurality of pieces in the touch-position detection directions x and y.

<<Smart Device>>

Figure 15:
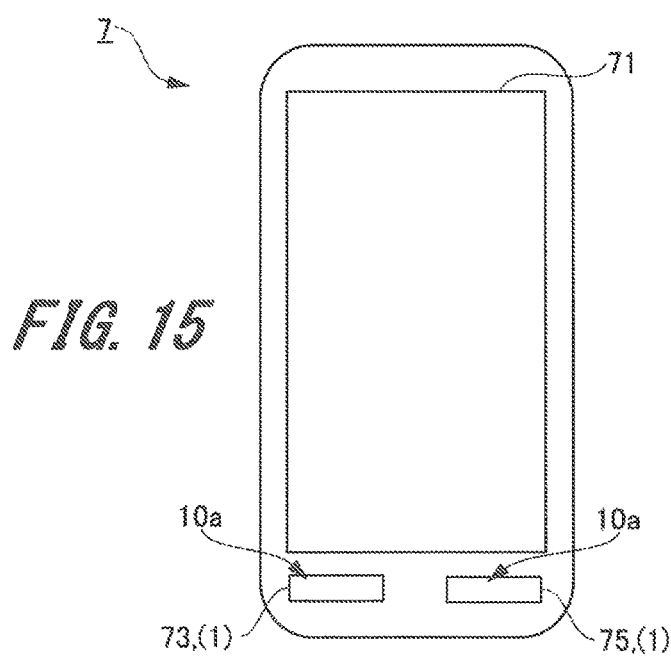
FIG. 15 is a plan view illustrating an example of a smart device including an organic electroluminescent module of the present invention.

FIG. 15 is a plan view of a smart device using an organic electroluminescent module. A smart device 7 illustrated in the drawing includes the organic electroluminescent module of the present invention described in the first to the fourth embodiments and the application examples 1 and 2.

The smart device 7 includes a main display unit 71, and icons 73 and 75 that turn out to be function key buttons, with any of the organic electroluminescent modules of the present invention described in the first to the fourth embodiments and the application examples 1 and 2 being used for the icons 73 and 75. Here, it is assumed that the organic electroluminescent module 1 of the first embodiment is used, for example.

The main display unit 71, including for example a liquid crystal display device, is configured to have a built-in sensor function as an "in-cell" or "on-cell" type. In addition, the organic electroluminescent module 1 included in the icons 73 and 75 is arranged with the touch surface 10a facing its front side.

The icons 73 and 75 may be patterned into various display patterns such as a "home key" expressed as a quadrangle mark, or a "return key" expressed as an arrow mark, for example. In addition, the icons 73 and 75 may be used as a screen scroll key, a volume control key, a luminance control key or the like, or may be configured to feedback a detected touch-position and cause the control position to emit light.

The icons 73 and 75 described above may be configured such that a display pattern is not visible when, for example, the organic electroluminescent module 1 is in a non light-emitting state, and touching the surface (i.e., the touch surface 10a) turns the organic electroluminescent module 1 into a light-emitting state and makes the display pattern visible.

<<Illumination Apparatus>>

The organic electroluminescent module of the present invention is also applicable to an illumination apparatus. An illumination apparatus including the organic electroluminescent module of the present invention may also be effectively used for display devices such as home illumination, car interior illumination, or backlight of liquid crystal display devices. In addition, there may be a wide range of applications such as backlight of clock, signboard advertisement, traffic signals, light source for optical storage media or the like, light source for electrophotographic copiers, light source for optical communication processors, light source for optical sensors, and further general home electric appliances, or the like, that require display devices.

Adding a touch-position detector function to the illumination apparatus described above by applying the organic electroluminescent module of the present invention thereto allows for performing luminance adjustment with information of touch operation being fed back, for example.

Note that, in the first to the fourth embodiments and the application examples 1 and 2 described above, a configuration of an organic electroluminescent module has been described in which one of the pair of the electrodes (the lower electrode and the upper electrode 15) included in the organic electroluminescent device EL, which is closer to the touch surface 10a, is used as the detection electrode Ed. However, the organic electroluminescent module of the present invention is not limited thereto and even the further one from the touch surface 10a may bring about a similar effect, provided that it has a part protruding from the electrode closer to the touch surface 10a in plan view and a touch-position detection direction is set in the part and used as the detection electrode Ed in a similar operation.

REFERENCE SIGNS LIST 1, 2, 2a, 3, 4, 5, 6 . . . organic electroluminescent module (illumination apparatus), 7 . . . smart device, 11 . . . lower electrode, 13 . . . organic luminescent functional layer, 15 . . . upper electrode, 20, 20', 20a', 20" . . . luminescent-device driving circuit unit, 30, 40 . . . touch-position detection circuit unit, 23, 23" . . . ground (luminescent-device driving circuit unit), 39, 49 . . . ground (touch-position detection circuit unit), EL . . . organic electroluminescent device, Ed . . . detection electrode, Eo . . . counter electrode, P . . . touch-position, LT . . . light-emitting period, ST . . . touch-position detection period, x, y . . . touch-position detection direction

The invention claimed is:

1. An organic electroluminescent module comprising:
an organic electroluminescent device having an organic luminescent functional layer provided between first and second electrodes, wherein the first electrode is a detection electrode;
a luminescent-device driving circuit unit connected to the first and second electrodes to control luminescence of the organic electroluminescent device; and
a touch-position detection circuit unit connected to both ends of the detection electrode in a touch-position detection direction,
wherein the touch-position detection circuit unit performs a detection of a touch-position by detecting electrical characteristics at the both ends of the detection electrode.

2. The organic electroluminescent module according to claim 1,
wherein the touch-position detection circuit unit detects the electrical characteristics at the both ends of the detection electrode during cyclic touch-position detection periods.

3. The organic electroluminescent module according to claim 2,
wherein the luminescent-device driving circuit unit sets the second electrode to a floating potential as a counter electrode during the touch-position detection periods.

4. The organic electroluminescent module according to claim 2,
wherein the luminescent-device driving circuit unit disconnects from the first and second electrodes during the touch-position detection periods.

5. The organic electroluminescent module according to claim 2,
wherein the luminescent-device driving circuit unit causes the organic electroluminescent device to emit light during a light-emitting period which is each time interval between the touch-position detection periods, and applies a reverse voltage to the organic electroluminescent device at an end of the light-emitting period.

6. The organic electroluminescent module according to claim 2,
wherein the luminescent-device driving circuit unit short-circuits the first and second electrodes during the touch-position detection periods.

7. The organic electroluminescent module according to claim 6,
wherein the luminescent-device driving circuit unit causes the organic electroluminescent device to emit light during a light-emitting period which is each time interval between the touch-position detection periods, and applies a same potential to the first and second electrodes at an end of the light-emitting period.

8. The organic electroluminescent module according to claim 2,
wherein the luminescent-device driving circuit unit and the touch-position detection circuit unit are respectively connected to independent grounds.

9. The organic electroluminescent module according to claim 1,
wherein the detection electrode has four corners including both ends of each two-dimensional direction of the detection electrode,
the touch-position detection circuit unit is connected to the four corners,
the touch-position detection circuit unit performs a touch-position detection by detecting electrical characteristics at the four corners.

10. The organic electroluminescent module according to claim 1, wherein;
a touch surface, on which the touch-position is to be detected, is formed on the detection electrode.

11. A smart device comprising the organic electroluminescent module according to claim 1.

12. An illumination apparatus comprising the organic electroluminescent module according to claim 1.

* * * * *